US012745355B2

(12) United States Patent
Myung et al.

(10) Patent No.: US 12,745,355 B2
(45) Date of Patent: Sep. 22, 2026

(54) SUPPORT PLATE HAVING A FOLDING PORTION WITH VARIABLE OPENING DENSITY FOR DISPLAY DEVICE

(71) Applicant: Samsung Display Co., Ltd., Yongin-si (KR)

(72) Inventors: Mansik Myung, Yongin-si (KR); Sungjune Park, Yongin-si (KR); Jaiku Shin, Yongin-si (KR); Jin Yong Sim, Yongin-si (KR); Sung Chul Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/671,850

(22) Filed: May 22, 2024

(65) Prior Publication Data

US 2024/0407113 A1 Dec. 5, 2024

(30) Foreign Application Priority Data

May 31, 2023 (KR) ........................ 10-2023-0070052

(51) Int. Cl.
*H05K 5/02* (2006.01)
*G06F 1/16* (2006.01)
(Continued)

(52) U.S. Cl.
CPC ......... *H05K 5/0217* (2013.01); *G06F 1/1618* (2013.01); *G06F 1/1652* (2013.01);
(Continued)

(58) Field of Classification Search
CPC ............... H05K 5/0217; H10K 77/111; H10K 2102/311; G06F 1/1618; G06F 1/1652;
(Continued)

(56) References Cited

U.S. PATENT DOCUMENTS 9,983,424 B2 * 5/2018 Kim ..................... H10K 77/111
10,334,750 B2 6/2019 Koo et al.
(Continued)

FOREIGN PATENT DOCUMENTS

CN 110518039 A * 11/2019 ............. G09F 9/301
CN 115588359 A 1/2023
(Continued)

OTHER PUBLICATIONS

International Search Report for PCT Application No. PCT/KR2024/005580 dated Jul. 30, 2024, 10 pages.

*Primary Examiner* — Allen L Parker
*Assistant Examiner* — Martin Antonio Asmat Uceda
(74) *Attorney, Agent, or Firm* — Womble Bond Dickinson (US) LLP

(57) ABSTRACT

A display device includes: a display panel; and a support plate under the display panel, and including a first non-folding portion, a folding portion, and a second non-folding portion, which are located along a first direction. The folding portion includes: a plurality of openings; and branches between the openings. An area ratio of the openings to the branches is greater at a portion of the folding portion adjacent to at least one of the first or second non-folding portions than at a center of the folding portion.

20 Claims, 24 Drawing Sheets

(51) Int. Cl.
*G09F 9/30* (2006.01)
*H04M 1/02* (2006.01)
*H10K 77/10* (2023.01)

(52) U.S. Cl.
CPC ............ *G06F 1/1681* (2013.01); *G09F 9/301* (2013.01); *H04M 1/0268* (2013.01); *H10K 77/111* (2023.02)

(58) Field of Classification Search
CPC .... G06F 1/1681; G06F 1/1641; G06F 1/1616; G09F 9/301; H04M 1/0268; H04M 1/0216; G02F 1/133308
See application file for complete search history.

(56) References Cited

U.S. PATENT DOCUMENTS

| | | | | |
|---|---|---|---|---|
| 11,656,655 | B2 | 5/2023 | Shin et al. | |
| 11,700,716 | B2 | 7/2023 | Shin et al. | |
| 11,977,413 | B2 * | 5/2024 | Naito | G06F 1/1652 |
| 2020/0295282 | A1 * | 9/2020 | Xiang | H10K 77/111 |
| 2021/0165454 | A1 | 6/2021 | Dong et al. | |
| 2021/0251090 | A1 * | 8/2021 | Ha | B32B 15/04 |
| 2021/0259119 | A1 | 8/2021 | Seo et al. | |
| 2021/0352814 | A1 | 11/2021 | Park et al. | |
| 2022/0173353 | A1 * | 6/2022 | Luo | H10K 59/87 |
| 2023/0068260 | A1 | 3/2023 | Naito | |
| 2023/0099705 | A1 | 3/2023 | Shin et al. | |
| 2023/0114378 | A1 * | 4/2023 | Han | G06F 1/1641 361/679.27 |
| 2023/0156934 | A1 * | 5/2023 | Jiang | G06F 1/1681 361/807 |
| 2023/0161377 | A1 | 5/2023 | Lee et al. | |
| 2023/0301136 | A1 * | 9/2023 | Chen | H10K 50/868 257/40 |
| 2023/0354533 | A1 * | 11/2023 | Fu | H04M 1/0268 |
| 2023/0409086 | A1 * | 12/2023 | Lin | G06F 1/1652 |

FOREIGN PATENT DOCUMENTS

| | | | |
|---|---|---|---|
| KR | 10-2022-0006669 | A | 1/2022 |
| KR | 10-2022-0136523 | A | 10/2022 |
| KR | 10-2456889 | B1 | 10/2022 |
| KR | 10-2023-0018001 | A | 2/2023 |
| KR | 10-2023-0044907 | A | 4/2023 |

* cited by examiner

DD
WM
HC
WP
AL1
WIN
AL2
DM
ISL
AL3
EP
AL4
PPL
DSP
AL5
BRL
AL6
PLT
I'
PIT
NFA2
AA1
FA
OP
BR
I
PCB
NFA1
DDV
AA2
BA
DR3
DR2
DR1

ED
WM
DM
PLT
NFA2
EX2
FA
CSP
FX
EX1
NFA1
DR3
DR2
DR1

SUPPORT PLATE HAVING A FOLDING PORTION WITH VARIABLE OPENING DENSITY FOR DISPLAY DEVICE

CROSS-REFERENCE TO RELATED APPLICATION

This application claims priority to and the benefit of Korean Patent Application No. 10-2023-0070052, filed on May 31, 2023, in the Korean Intellectual Property Office, the entire content of which is incorporated by reference herein.

BACKGROUND

1. Field

Aspects of embodiments of the present disclosure relate to a display device.

2. Description of the Related Art

In general, a display device includes a display module to display an image, and a supporter to support the display module. The display module includes a display panel to display the image, a window disposed on the display panel to protect the display panel from external scratches and impacts, and a protective layer disposed under the display panel to protect the display panel from external impacts. The supporter has a rigidity stronger than that of the display module, and supports the display module.

The above information disclosed in this Background section is for enhancement of understanding of the background of the present disclosure, and therefore, it may contain information that does not constitute prior art.

SUMMARY

In recent years, with technological development for the display device, a flexible display device capable of being transformed into various suitable shapes is being developed. The flexible display device includes a flexible display module that is foldable or rollable. The flexible display device may include a support plate disposed under the flexible display module, and the support plate may be folded together with the display module that is folded with respect to a folding axis.

One or more embodiments of the present disclosure are directed to a display device capable of increasing a rigidity of a center of a folding portion of a support plate to reduce stress that may be applied to a display module while being folded.

According to one or more embodiments of the present disclosure, a display device includes: a display panel; and a support plate under the display panel, and including a first non-folding portion, a folding portion, and a second non-folding portion, which are located along a first direction. The folding portion includes: a plurality of openings; and branches between the openings. An area ratio of the openings to the branches is greater at a portion of the folding portion adjacent to at least one of the first or second non-folding portions than at a center of the folding portion.

In an embodiment, the branches may include: a plurality of first branches between the openings that are adjacent to each other in the first direction; and a plurality of second branches between the openings that are adjacent to each other in a second direction crossing the first direction.

In an embodiment, the folding portion may be configured to be folded with respect to a folding axis overlapping with the center of the folding portion and parallel to the second direction, and the folding axis may overlap with one of the first branches.

In an embodiment, at least one of a length in the first direction of the first branches, a length in the second direction of the second branches, a length in the first direction of the openings, or a length in the second direction of the openings may be varied as a distance from the center of the folding portion increases.

In an embodiment, in a plan view, the length in the first direction of the first branches may decrease as the distance from the center of the folding portion increases in the first direction.

In an embodiment, in a plan view, the length in the first direction of the openings may increase as the distance from the center of the folding portion increases in the first direction.

In an embodiment, in a plan view, the length in the second direction of the openings may increase as the distance from the center of the folding portion in the first direction increases.

In an embodiment, in a plan view, the length in the second direction of the second branches located between the openings that are adjacent to each other in the second direction may decrease as the distance from the center of the folding portion in the first direction increases.

In an embodiment, the length in the second direction of the second branches may decrease as the distance from the center of the folding portion increases, and the length in the second direction of the openings may be uniform.

In an embodiment, the length in the first direction of the openings may increase as the distance from the center of the folding portion increases, and the length in the first direction of the first branches may be uniform.

In an embodiment, the folding portion may further include: a center portion overlapping with the center of the folding portion in a plan view; and sub-folding portions at opposite sides of the center portion in the first direction, and symmetrical with each other.

In an embodiment, the center portion and each of the sub-folding portions may include: a plurality of first branches between the openings that are adjacent to each other in the first direction; and a plurality of second branches between the openings that are adjacent to each other in a second direction crossing the first direction.

In an embodiment, in a plan view, an area between the openings defined through the center portion may be different from an area between the openings defined through the sub-folding portions.

In an embodiment, the first branches of the center portion may have the same length as each other, the first branches of a sub-folding portion from among the sub-folding portions may have the same length as each other, and a length in the first direction of the first branches of the sub-folding portion from among the sub-folding portions may be smaller than a length in the first direction of the first branches of the center portion.

In an embodiment, the openings defined through the center portion may be have the same length as each other in the second direction, the openings defined through a sub-folding portion from among the sub-folding portions may have the same length as each other in the second direction, and the length in the second direction of the openings defined through the center portion may be smaller than the length in the second direction of the openings defined through the sub-folding portion from among the sub-folding portions.

In an embodiment, the second branches of the center portion may have the same length as each other in the second direction, the second branches of the sub-folding portion from among the sub-folding portions may have the same length as each other in the second direction, and the length in the second direction of the second branches of the center portion may be greater than the length in the second direction of the second branches of the sub-folding portion from among the sub-folding portions.

In an embodiment, the openings defined through the center portion may have the same length as each other in the first direction, the openings defined through a sub-folding portion from among the sub-folding portions may have the same length as each other in the first direction, and the length in the first direction of the openings defined through the center portion may be smaller than the length in the first direction of the openings defined through the sub-folding portion from among the sub-folding portions.

In an embodiment, when the display panel is folded, a portion of the display panel that overlaps with the folding portion may be bent to have a first diameter in a direction parallel to the first direction, and a second diameter in a third direction perpendicular to a plane defined by the first direction and a second direction crossing the first direction, and a ratio of the first diameter to the second diameter may be within a range from about 1 to about 1.2.

According to one or more embodiments of the present disclosure, a display device includes: a display panel; and a support plate under the display panel, and including a first non-folding portion, a folding portion, and a second non-folding portion, which are located along a first direction so that the folding portion is between the first and second non-folding portions. The folding portion includes: a plurality of first branches located between openings that are adjacent to each other in the first direction from among openings defined through the folding portion; and a plurality of second branches located between openings adjacent to each other in a second direction crossing the first direction from among the openings defined through the folding portion. In a plan view, an area ratio of the openings to the first and second branches increases starting from a center of the folding portion to the first and second non-folding portions.

In an embodiment, the folding portion may be configured to be folded with respect to a folding axis parallel to the second direction, the folding axis may overlap with one of the first branches in a plan view, and at least one of a length in the first direction of the first branches, a length in the second direction of the second branches, a length in the first direction of the openings, or a length in the second direction of the openings may be varied as a distance from the center of the folding portion increases.

According to one or more embodiments of the present disclosure, openings may be defined through a folding portion, and branches may be disposed between the openings. An area ratio of the openings to the branches may be increased as a distance from the center of the folding portion increases, and a rigidity of the folding portion may be greater at the center of the folding portion than in a portion of the folding portion adjacent to non-folding portions. Accordingly, when the folding portion is bent, a curvature of the center of the folding portion may be decreased, and thus, stress applied to a display module and a window module, which are disposed on the center of the folding portion, may be reduced. Consequently, a possibility of damage that may be caused to the display module and the window module due to the stress may be reduced.

BRIEF DESCRIPTION OF THE DRAWINGS

The above and other aspects and features of the present disclosure will be more clearly understood from the following detailed description of the illustrative, non-limiting embodiments with reference to the accompanying drawings, in which:

FIGS. 15A and 15B are views of a support plate according to an embodiment of the present disclosure;

FIG. 18 is a cross-sectional view of a window module, a display module, and a support plate shown in FIG. 9A;

DETAILED DESCRIPTION

Figure 1:
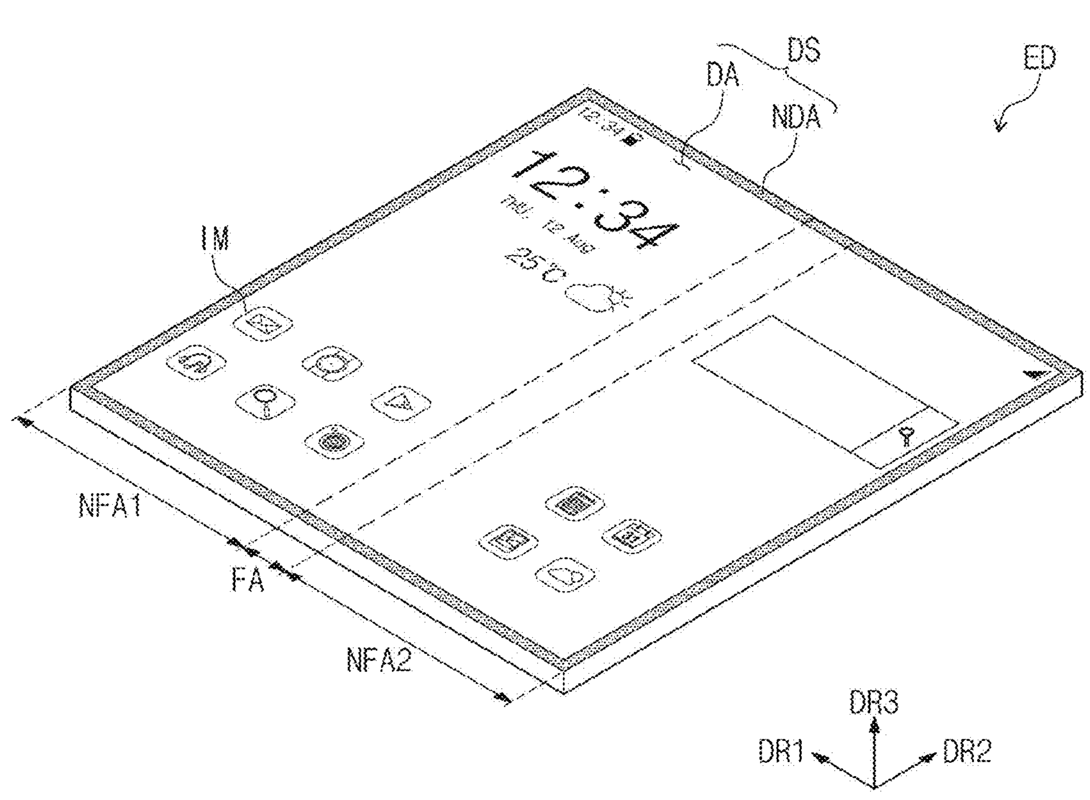
FIG. 1 is a perspective view of an electronic device according to an embodiment of the present disclosure.

Features of the inventive concept and methods of accomplishing the same may be understood more readily by reference to the following detailed description of preferred embodiments and the accompanying drawings. The inventive concept may, however, be embodied in many different forms and should not be construed as being limited to the embodiments set forth herein. Rather, these embodiments are provided so that this disclosure will be through and complete and will fully convey the inventive concept to those skilled in the art, and the inventive concept will only be defined by the appended claims. Like reference numerals denote like elements throughout the specification.

In the present disclosure, it will be understood that when an element or layer is referred to as being “on”, “connected to” or “coupled to” another element or layer, it can be directly on, connected or coupled to the other element or layer or intervening elements or layers may be present. As used herein, the term “and/or” includes any and all combinations of one or more of the associated listed items.

Spatially relative terms, such as “beneath”, “below”, “lower”, “above”, “upper” and the like, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Embodiments described in the disclosure are described with reference to plan views and cross-sectional views that are ideal schematic diagrams. Accordingly, shapes of the views may vary depending on manufacturing technologies and/or tolerances. Thus, embodiments are not limited to shown specific forms and also include variations in form produced according to manufacturing processes. Therefore, regions illustrated in the drawings are merely examples, and the shapes of the regions illustrated in the drawings are intended to illustrate the specific shapes of the regions of elements and not to limit the scope of the present disclosure.

Hereinafter, embodiments of the present disclosure will be described with reference to accompanying drawings.

Figure 2A:
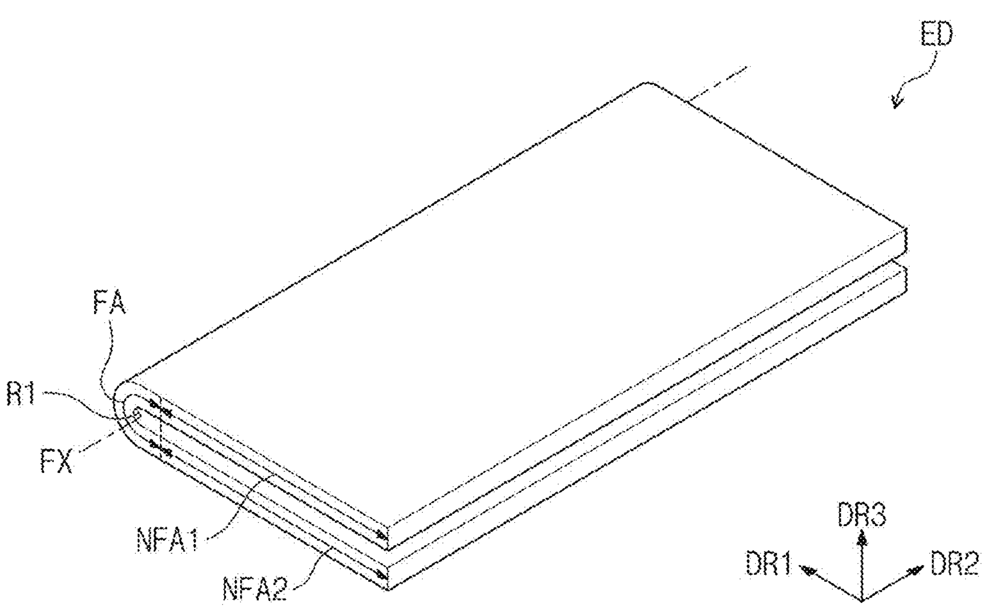
FIGS. 2A and 2B are perspective views of folded states of the electronic device shown in FIG. 1.
Figure 2B:
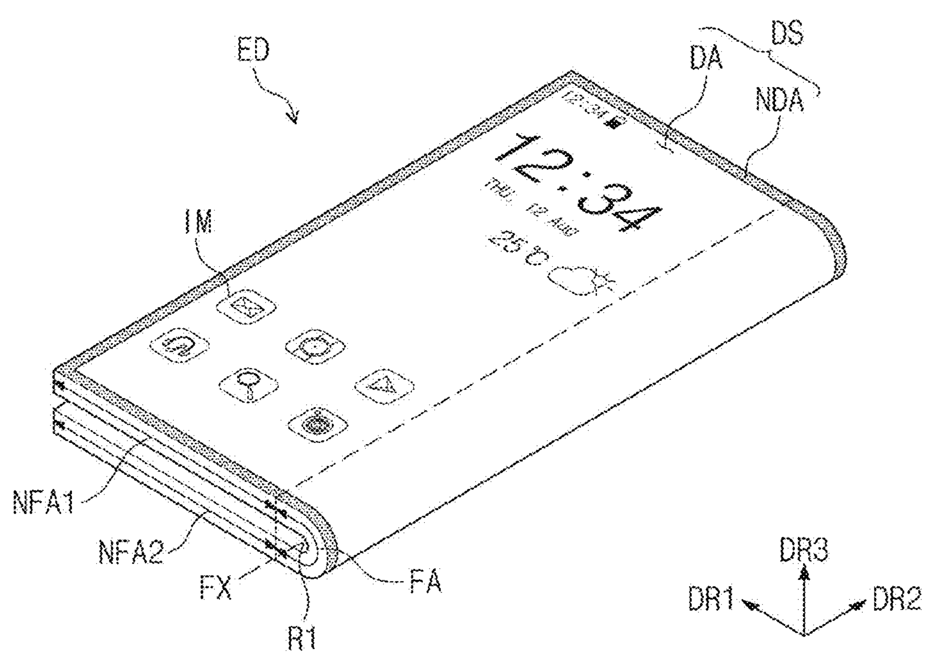

FIG. 1 is a perspective view of an electronic device ED according to an embodiment of the present disclosure. FIGS. 2A and 2B are perspective views of folded states of the electronic device ED shown in FIG. 1.

Referring to FIG. 1, the electronic device ED may have a rectangular shape defined by short sides extending in a first direction DR1, and long sides extending in a second direction DR2 crossing or intersecting the first direction DR1. However, the shape of the electronic device ED is not limited to the rectangular shape, and the electronic device ED may have various suitable shapes, such as a circular shape, a polygonal shape, or the like. The electronic device ED may be flexible.

Hereinafter, a direction perpendicular to or substantially perpendicular to a plane defined by the first direction DR1 and the second direction DR2 may be referred to as a third direction DR3. As used in the present disclosure, the expressions “when viewed in a plane” and “in a plan view” may refer to a state of being viewed in the third direction DR3.

The electronic device ED may include a folding area FA, and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The second non-folding area NFA2, the folding area FA, and the first non-folding area NFA1 may be arranged along the first direction DR1.

In the present embodiment, one folding area FA and two non-folding areas NFA1 and NFA2 are shown in FIG. 1 as a representative example. However, the present disclosure is not limited thereto, and the number of the folding area FA and the number of the non-folding areas NFA1 and NFA2 are not limited thereto or thereby. For example, the electronic device ED may include two or more non-folding areas, and one or more folding areas disposed between the non-folding areas.

An upper surface of the electronic device ED may be referred to as a display surface DS. The display surface DS may include a plane defined by the first direction DR1 and the second direction DR2. Images IM generated by the electronic device ED may be provided to a user through the display surface DS.

The display surface DS may include a display area DA, and a non-display area NDA around (e.g., adjacent to) the display area DA. The display area DA may display an image, and the non-display area NDA may not display an image. The non-display area NDA may surround (e.g., around a periphery of) the display area DA, and may define an edge of the electronic device ED, which is printed by a suitable color (e.g., a predetermined color).

Referring to FIGS. 2A and 2B, the electronic device ED may be a foldable electronic device ED that may be folded or unfolded. As an example, the folding area FA may be folded with respect to a folding axis FX that is parallel to or substantially parallel to the second direction DR2, and thus, the electronic device ED may be folded along the folding axis FX. The folding axis FX may be defined as a major axis that is parallel to or substantially parallel to the long sides of the electronic device ED. When the electronic device ED is folded, the first non-folding area NFA1 and the second non-folding area NFA2 may face each other, and the display surface DS may not be exposed to the outside. In other words, the electronic device ED may be inwardly folded (e.g., in-folding) as illustrated in FIG. 2A. However, the present disclosure is not limited thereto or thereby. As another example, the electronic device ED may be outwardly folded (e.g., out-folding) with respect to the folding axis FX, such that the display surface DS may be exposed to the outside as illustrated in FIG. 2B. As another example, the electronic device ED may be both (e.g., concurrently or substantially simultaneously) in-folded and out-folded.

Figure 3:
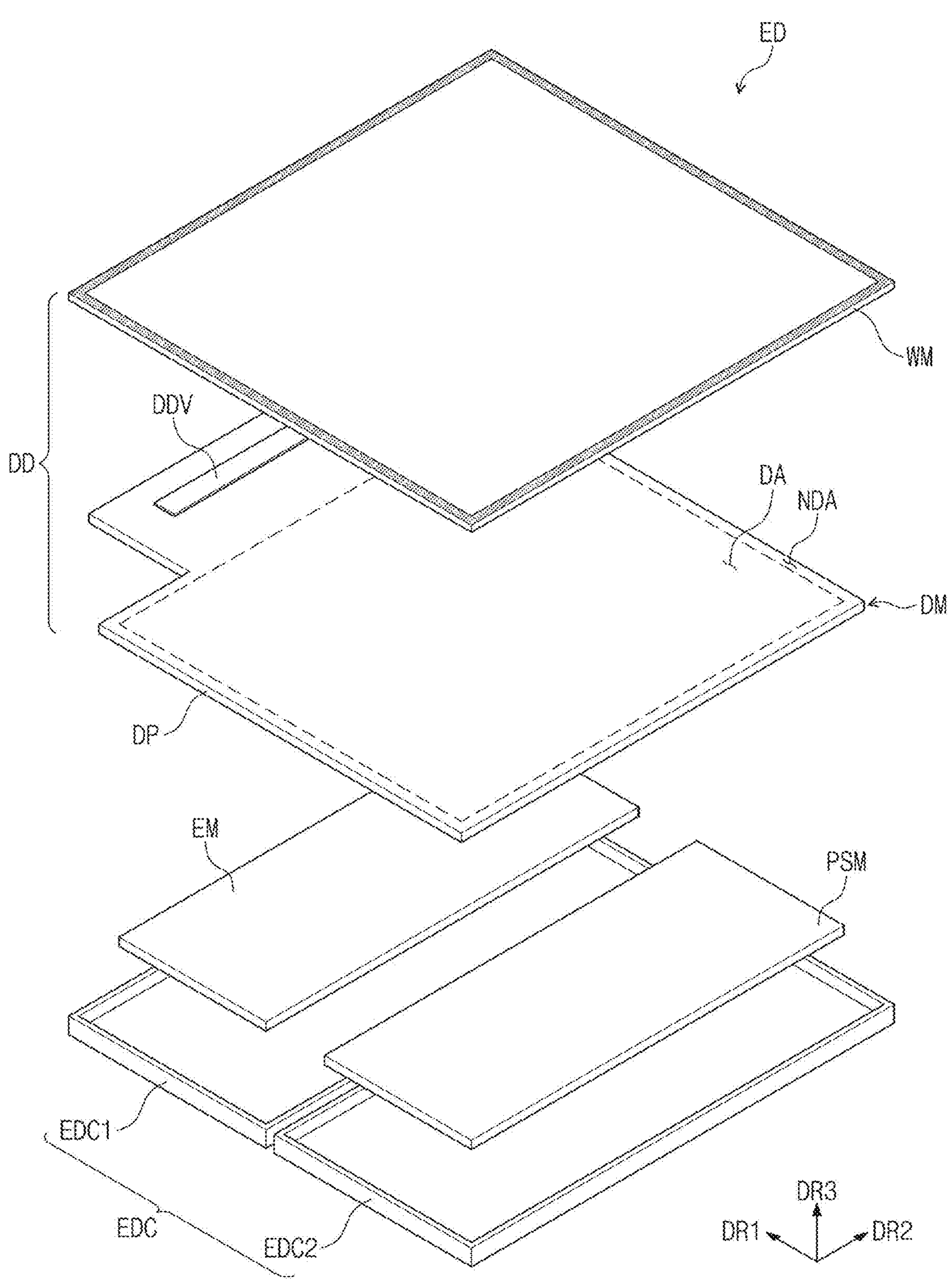
FIG. 3 is an exploded perspective view of the electronic device shown in FIG. 1.

FIG. 3 is an exploded perspective view of the electronic device ED shown in FIG. 1.

Referring to FIG. 3, the electronic device ED may include a display device DD, an electronic module (e.g., an electronic circuit or device) EM, a power module (e.g., a power supply, a battery, and the like) PSM, and a case EDC. In some embodiments, the electronic device ED may further include a mechanical structure, for example, such as a hinge structure, to control a folding operation of the display device DD.

The display device DD may generate an image, and may sense an external input. The display device DD may include a window module (e.g., a window layer or member) WM and a display module (e.g., a display or a touch-display) DM. The window module WM may provide a front surface of the electronic device ED. The window module WM may be disposed on the display module DM, and may protect the display module DM. The window module WM may transmit light generated by the display module DM to provide the light to a user.

The display module DM may include a display panel DP. FIG. 3 shows the display panel DP from among various components of the display module DM, but the present disclosure is not limited thereto. The display module DM may further include a plurality of components disposed on and/or under the display panel DP. A more detailed stacked structure of the display module DM will be described in more detail below. The display panel DP may include a display area DA and a non-display area NDA, which correspond to the display area DA and the non-display area NDA, respectively, of the electronic device ED illustrated in FIG. 1.

The display module DM may include a data driver DDV disposed in the non-display area NDA of the display panel DP. The data driver DDV may be manufactured in an integrated circuit chip form, and may be mounted in the non-display area NDA. However, the present disclosure is not limited thereto or thereby. According to an embodiment, the data driver DDV may be mounted on a flexible circuit board that is connected to the display panel DP.

The electronic module EM and the power module PSM may be disposed under the display device DD. The electronic module EM and the power module PSM may be connected to each other via a separate flexible circuit board. The electronic module EM may control an operation of the display device DD. The power module PSM may supply power to the electronic module EM.

The case EDC may accommodate the display device DD, the electronic module EM, and the power module PSM. The case EDC may include, for example, first and second cases EDC1 and EDC2, so that the display device DD may be folded. The first and second cases EDC1 and EDC2 may extend in the second direction DR2, and may be arranged along the first direction DR1.

In some embodiments, the electronic device ED may further include a hinge structure to connect the first and second cases EDC1 and EDC2 to each other. The case EDC may be connected to (e.g., attached to or coupled to) the window module WM. The case EDC may protect the display device DD, the electronic module EM, and the power module PSM.

Figure 4:
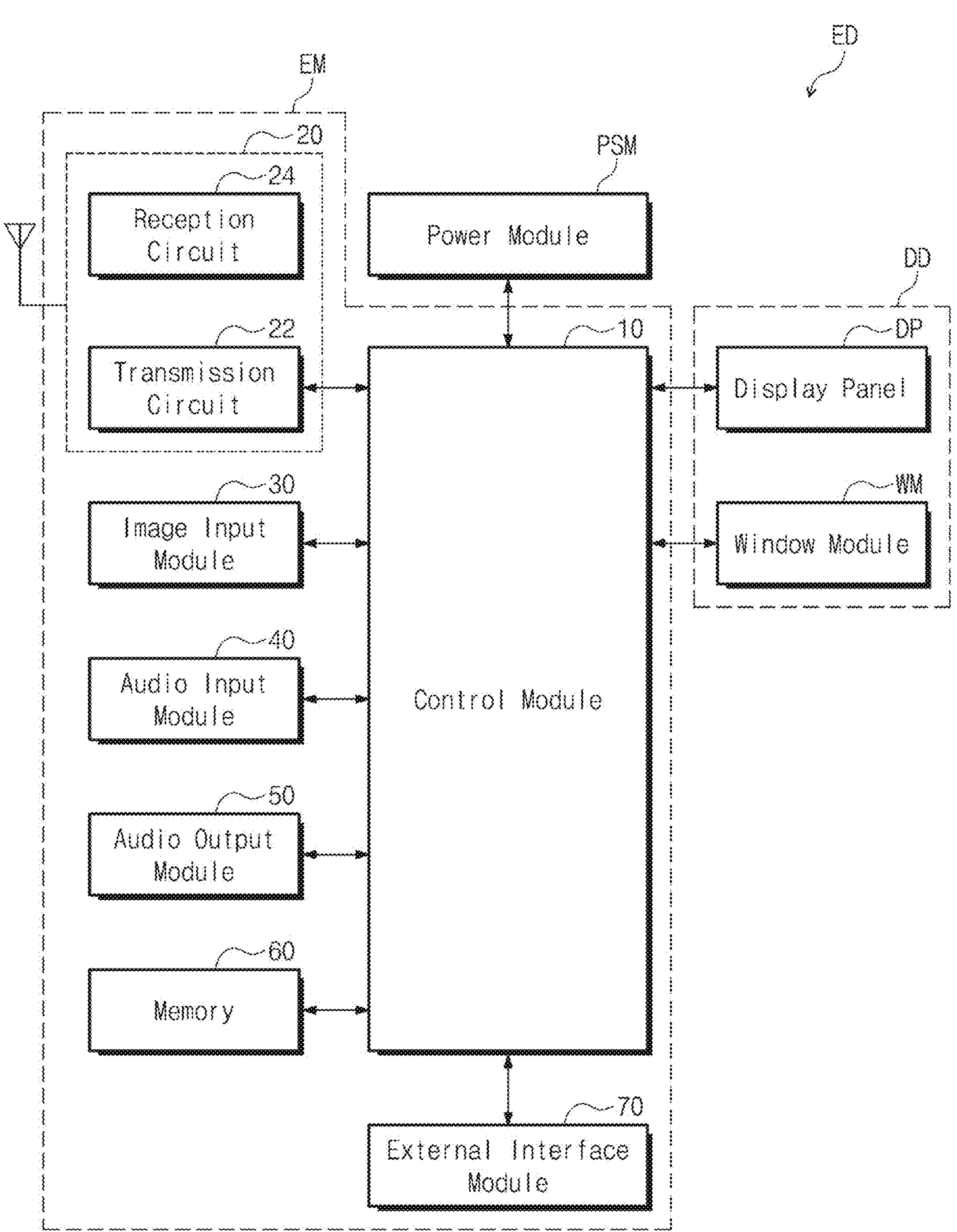
FIG. 4 is a block diagram of the electronic device shown in FIG. 3.

FIG. 4 is a block diagram of the electronic device ED shown in FIG. 3.

Referring to FIG. 4, the electronic device ED may include the electronic module EM, the power module PSM, and the display device DD. The electronic module EM may include a control module (e.g., a controller) 10, a wireless communication module (e.g., a wireless communication circuit or device) 20, an image input module (e.g., an image input device) 30, an audio input module (e.g., an audio input device or microphone) 40, an audio output module (e.g., an audio output device or speaker) 50, a memory 60, and an external interface module (e.g., an external interface) 70. The modules may be mounted on a circuit board to be electrically connected to each other, or may be electrically connected to each other through a flexible circuit board. The electronic module EM may be electrically connected to the power module PSM.

The control module 10 may control overall operations of the electronic device ED. For example, the control module 10 may activate or deactivate the display device DD in response to a user's input. The control module 10 may control the other modules, such as the image input module 30, the audio input module 40, the audio output module 50, or the like, in response to the user's input. The control module 10 may include at least one microprocessor.

The wireless communication module 20 may transmit/receive a wireless signal to/from other terminals using a Bluetooth link or a WiFi link. The wireless communication module 20 may transmit/receive a voice signal using a general communication line. The wireless communication module 20 may include a transmission circuit 22 that modulates a signal to be transmitted to transmit the modulated signal, and a reception circuit 24 that demodulates the signal applied thereto.

The image input module 30 may process an image signal, and may convert the image signal into image data that may be displayed through the display device DD. The audio input module 40 may receive an external sound signal through a microphone in a record mode or a voice recognition mode, and may convert the external sound signal to electrical voice data. The audio output module 50 may convert sound data provided thereto from the wireless communication module 20 or sound data stored in the memory 60, and may output the converted sound data to the outside.

The external interface module 70 may serve as an interface between the control module 10 and external devices, such as an external charger, a wired/wireless data port, a card socket (e.g., a memory card and/or a SIM/UIM card), and the like.

The power module PSM may supply power used for the overall operation of the electronic device ED. The power module PSM may include a battery or a battery device.

Figure 5:
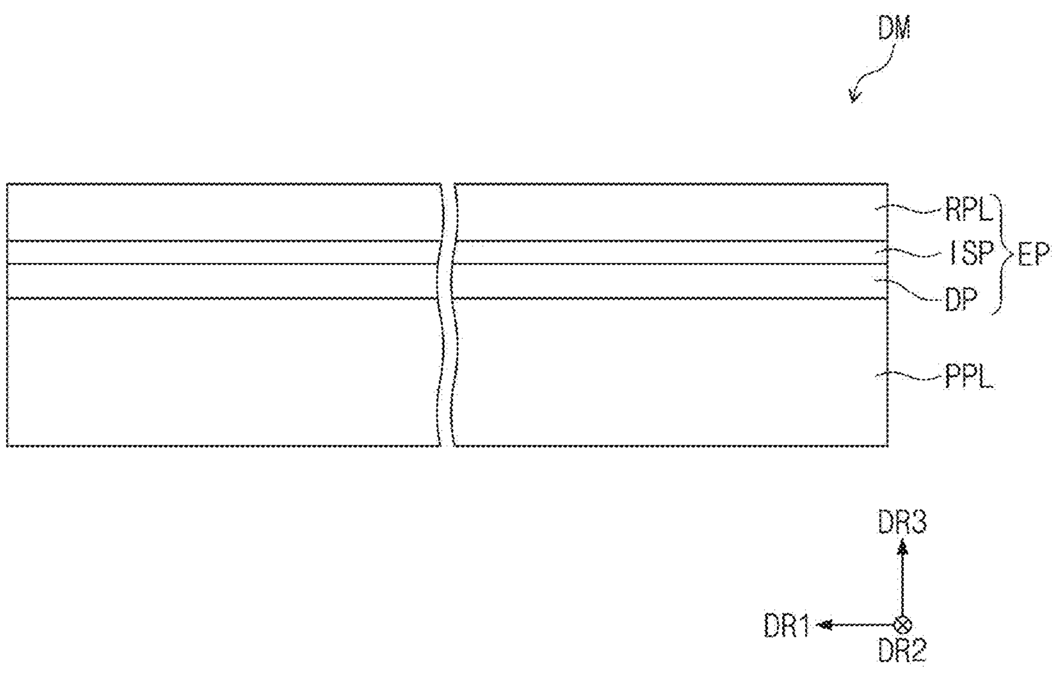
FIG. 5 is a cross-sectional view of a display module shown in FIG. 3.

FIG. 5 is a cross-sectional view of the display module DM shown in FIG. 3.

Referring to FIG. 5, the display module DM may include the display panel DP, an input sensing part ISP disposed on the display panel DP, an anti-reflective layer RPL disposed on the input sensing part ISP, and a panel protective layer PPL disposed under the display panel DP. The display panel DP may be a flexible display panel. As an example, the display panel DP may include a flexible substrate, and a plurality of elements disposed on the flexible substrate.

According to an embodiment, the display panel DP may be a light emitting display panel, but the present disclosure is not particularly limited thereto. As an example, the display panel DP may be an organic light emitting display panel or an inorganic light emitting display panel. A light emitting layer of the organic light emitting display panel may include an organic light emitting material. A light emitting layer of the inorganic light emitting display panel may include a quantum dot or a quantum rod. Hereinafter, for convenience, the organic light emitting display panel will be described in more detail as a representative example of the display panel DP.

The input sensing part ISP may include a plurality of sensors to sense an external input by a capacitive method. The input sensing part ISP may be directly manufactured on the display panel DP when the display module DM is manufactured.

The anti-reflective layer RPL may be disposed on the input sensing part ISP. The anti-reflective layer RPL may be directly formed on the input sensing part ISP when the display module DM is manufactured. The anti-reflective layer RPL may be defined as an external light reflection prevention film. The anti-reflective layer RPL may decrease a reflectance of external light incident to the display panel DP from above the display device DD.

As an example, the input sensing part ISP may be disposed directly on the display panel DP, and the anti-reflective layer RPL may be directly formed on the input sensing part ISP, but the present disclosure is not limited thereto or thereby. As another example, the input sensing part ISP may be attached to the display panel DP by an adhesive layer after being manufactured separately from the display panel DP, and the anti-reflective layer RPL may be attached to the input sensing part ISP by an adhesive layer after being manufactured separately from the input sensing part ISP.

The display panel DP, the input sensing part ISP, and the anti-reflective layer RPL may be defined as an electronic panel EP.

The panel protective layer PPL may be disposed under the display panel DP. The panel protective layer PPL may protect a lower portion (e.g., a rear surface) of the display panel DP. The panel protective layer PPL may include a flexible plastic material. As an example, the panel protective layer PPL may include polyethylene terephthalate (PET).

Figure 6:
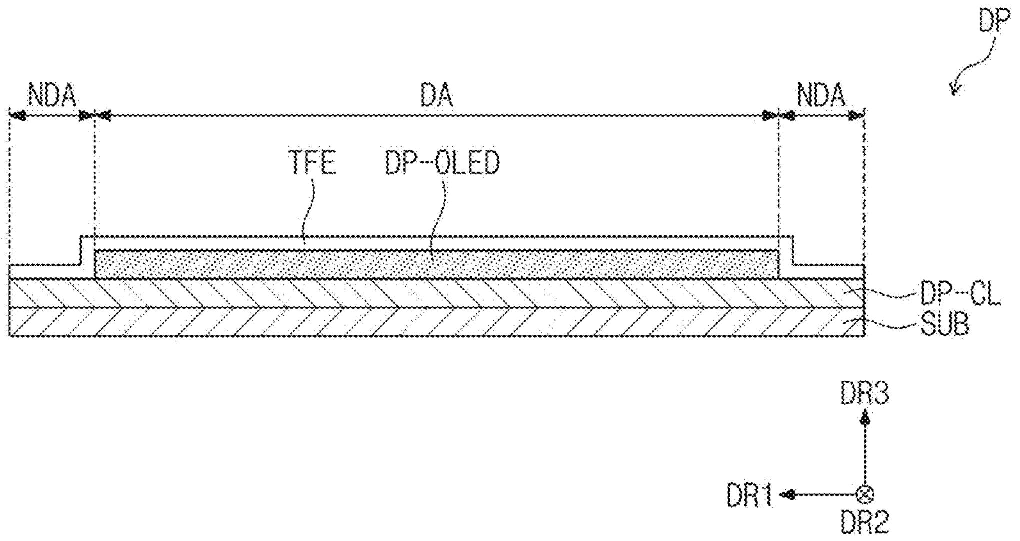
FIG. 6 is a cross-sectional view of a display panel shown in FIG. 5.

FIG. 6 is a cross-sectional view of the display panel DP shown in FIG. 5.

FIG. 6 shows a cross-section of the display panel DP when viewed in the second direction DR2 as a representative example.

Referring to FIG. 6, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include the display area DA, and the non-display area NDA around (e.g., adjacent to) the display area DA. The substrate SUB may include a flexible plastic material, such as polyimide (PI). The display element layer DP-OLED may be disposed in the display area DA.

A plurality of pixels may be disposed in the circuit element layer DP-CL and the display element layer DP-OLED. Each pixel may include a transistor disposed in the circuit element layer DP-CL, and a light emitting element disposed in the display element layer DP-OLED and connected to the transistor. The configuration of the pixel will be described in more detail below with reference to FIG. 8.

The thin film encapsulation layer TFE may be disposed on the circuit element layer DP-CL to cover the display element layer DP-OLED. The thin film encapsulation layer TFE may protect the pixels from moisture, oxygen, and foreign substances, such as dust particles.

Figure 7:
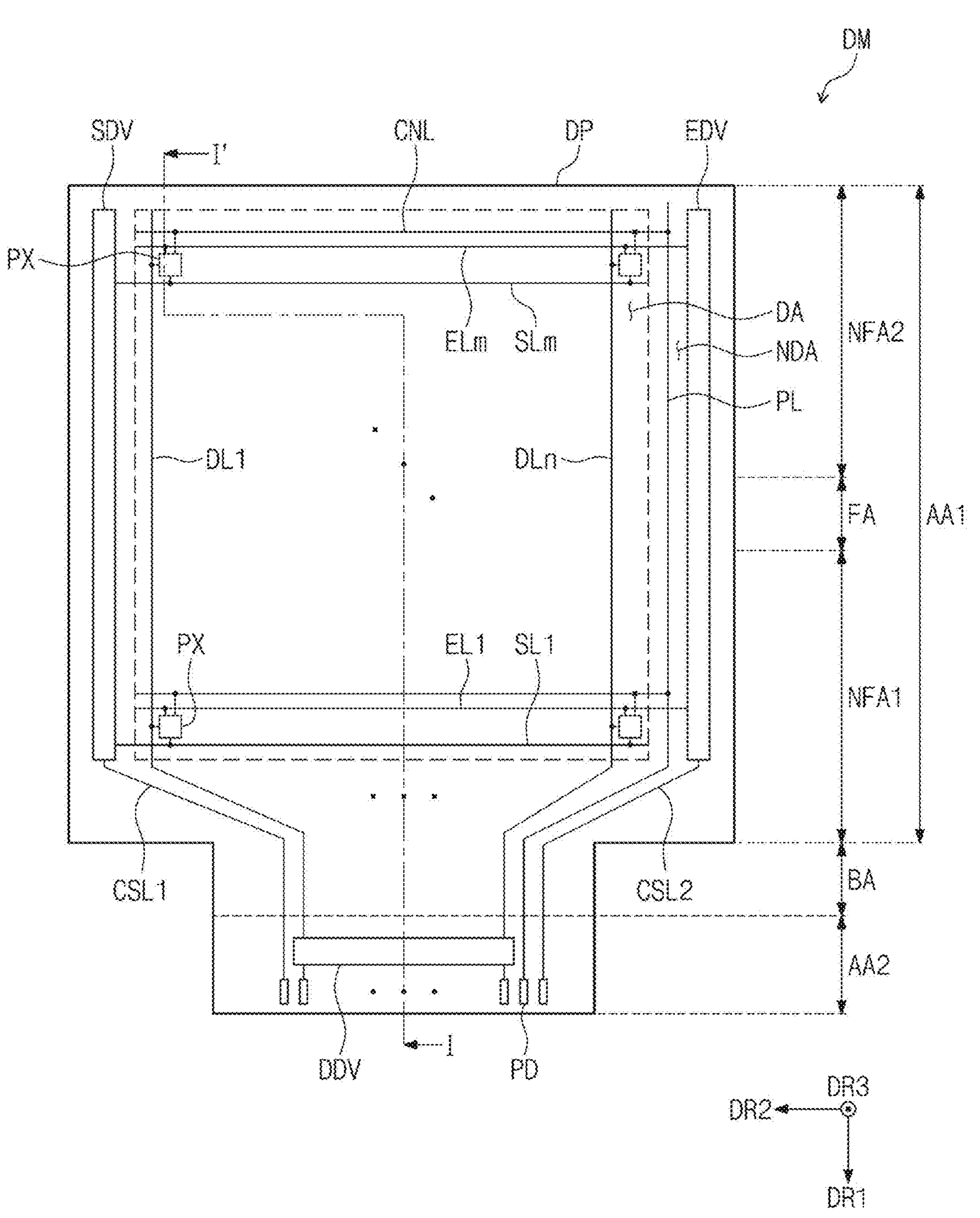
FIG. 7 is a plan view of a display panel shown in FIG. 3.

FIG. 7 is a plan view of the display panel DP shown in FIG. 3.

Referring to FIG. 7, the display module DM may include the display panel DP, a scan driver SDV, the data driver DDV, and an emission driver EDV.

The display panel DP may include a first area AA1, a second area AA2, and a bending area BA between the first area AA1 and the second area AA2. The bending area BA may extend in the second direction DR2, and the first area AA1, the bending area BA, and the second area AA2 may be arranged along the first direction DR1.

The first area AA1 may include the display area DA, and at least a portion of the non-display area NDA around (e.g., adjacent to) the display area DA. The non-display area NDA may surround (e.g., around a periphery of) the display area DA. The display area DA may be an area in which an image is displayed, and the non-display area NDA may be an area in which an image is not displayed. The second area AA2 and the bending area BA may be areas in which an image is not displayed.

When viewed in the third direction DR3, the first area AA1 may include the first non-folding area NFA1, the second non-folding area NFA2, and the folding area FA between the first non-folding area NFA1 and the second non-folding area NFA2.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a power line PL, a plurality of connection lines CNL, and a plurality of pads PD. Here, each of m and n is a natural number. The pixels PX may be arranged in the display area DA, and may be connected to the scan lines SL1 to SLm, the data lines DL1 to DLn, and the emission lines EL1 to ELm.

The scan driver SDV and the emission driver EDV may be disposed in the non-display area NDA. The scan driver SDV and the emission driver EDV may be disposed in the non-display area NDA to be adjacent to both sides (e.g., opposite side), respectively, of the first area AA1, which are opposite to each other in the second direction DR2. The data driver DDV may be disposed in the second area AA2. The data driver DDV may be manufactured in an integrated circuit chip form, and may be mounted in the second area AA2.

The scan lines SL1 to SLm may extend in the second direction DR2, and may be connected to the scan driver SDV. The data lines DL1 to DLn may extend in the first direction DR1, and may be connected to the data driver DDV via the bending area BA. The emission lines EL1 to ELm may extend in the second direction DR2, and may be connected to the emission driver EDV.

The power line PL may extend in the first direction DR1, and may be disposed in the non-display area NDA. The power line PL may be disposed between the display area DA and the emission driver EDV, but the present disclosure is not limited thereto or thereby. In other words, the power line PL may be disposed between the display area DA and the scan driver SDV.

The power line PL may extend to the second area AA2 via the bending area BA. When viewed in a plane (e.g., in a plan view), the power line PL may extend to a lower end of the second area AA2. The power line PL may receive a driving voltage.

The connection lines CNL may extend in the second direction DR2, and may be arranged along the first direction DR1. The connection lines CNL may be connected to the power line PL and the pixels PX. The driving voltage may be applied to the pixels PX via the power line PL and the connection lines CNL connected to the power line PL.

The first control line CSL1 may be connected to the scan driver SDV, and may extend toward the lower end of the second area AA2 via the bending area BA. The second control line CSL2 may be connected to the emission driver EDV, and may extend toward the lower end of the second area AA2 via the bending area BA. The data driver DDV may be disposed between the first control line CSL1 and the second control line CSL2.

When viewed in the plane (e.g., in a plan view), the pads PD may be disposed adjacent to the lower end of the second area AA2. The data driver DDV, the power line PL, the first control line CSL1, and the second control line CSL2 may be connected to the pads PD.

The data lines DL1 to DLn may be connected to corresponding pads PD via the data driver DDV. As an example, the data lines DL1 to DLn may be connected to the data driver DDV, and the data driver DDV may be connected to the pads PD corresponding to the data lines DL1 to DLn.

A printed circuit board may be connected to the pads PD, and a timing controller and a voltage generator may be disposed on the printed circuit board. The timing controller may be manufactured in an integrated circuit chip form, and may be mounted on the printed circuit board. The timing controller and the voltage generator may be connected to the pads PD via the printed circuit board.

The timing controller may control an operation of the scan driver SDV, the data driver DDV, and the emission driver EDV. The timing controller may generate a scan control signal, a data control signal, and an emission control signal in response to control signals applied thereto from the outside. The voltage generator may generate the driving voltage.

The scan control signal may be applied to the scan driver SDV via the first control line CSL1. The emission control signal may be applied to the emission driver EDV via the second control line CSL2. The data control signal may be applied to the data driver DDV. The timing controller may receive image signals from the outside, may convert a data format of the image signals to a data format appropriate to an interface between the timing controller and the data driver DDV, and may provide the converted image signals to the data driver DDV.

The scan driver SDV may generate a plurality of scan signals in response to the scan control signal. The scan signals may be applied to the pixels PX via the scan lines SL1 to SLm. The scan signals may be sequentially applied to the pixels PX.

The data driver DDV may generate a plurality of data voltages corresponding to the image signals in response to the data control signal. The data voltages may be applied to the pixels PX via the data lines DL1 to DLn. The emission driver EDV may generate a plurality of emission signals in response to the emission control signal. The emission signals may be applied to the pixels PX via the emission lines EL1 to ELm.

The pixels PX may receive the data voltages in response to the scan signals. The pixels PX may emit light having a luminance corresponding to the data voltages in response to the emission signals, and thus, an image may be displayed. An emission time of the pixels PX may be controlled by the emission signals.

Figure 8:
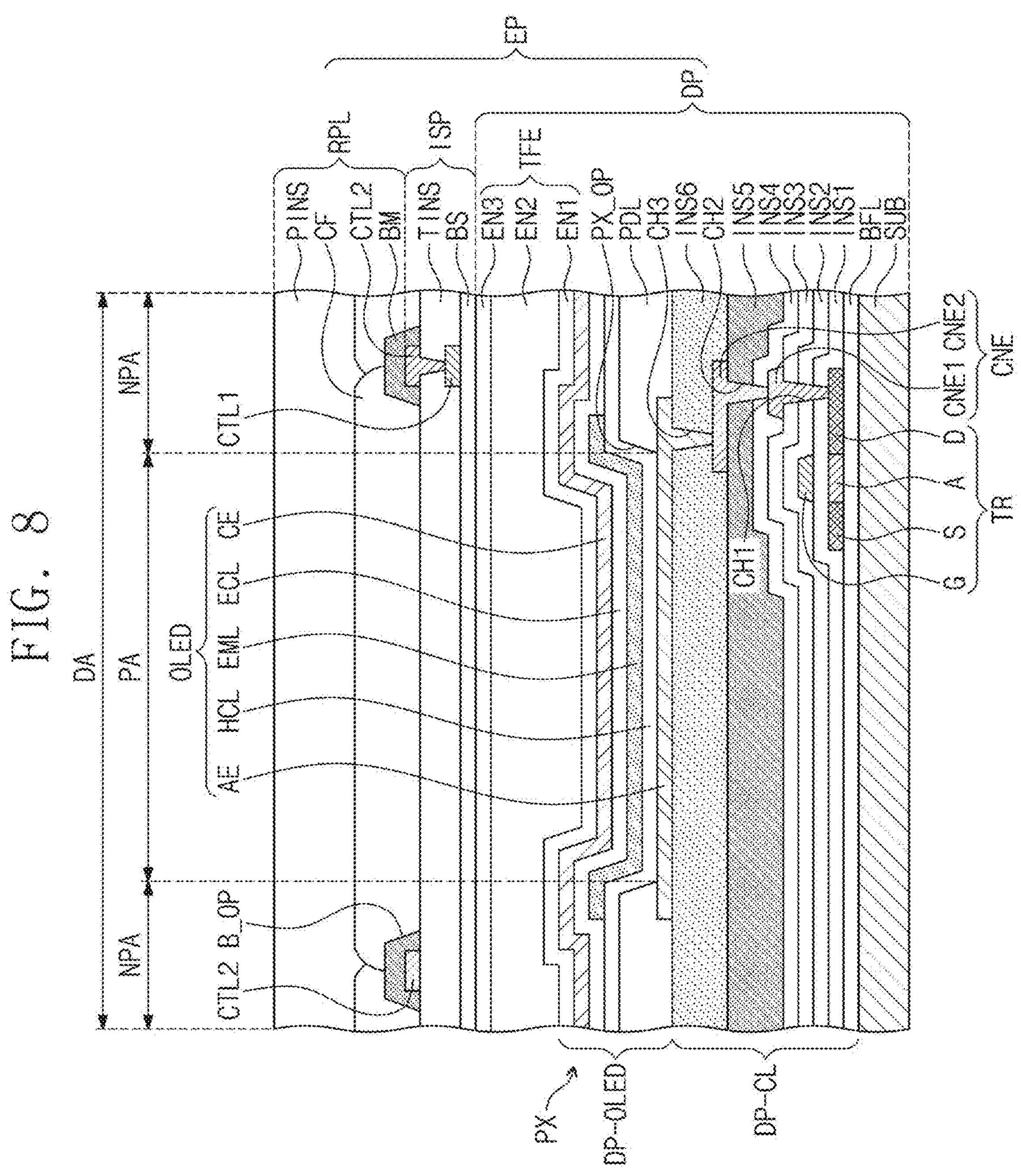
FIG. 8 is a cross-sectional view of an electronic panel corresponding to one pixel shown in FIG. 7.

FIG. 8 is a cross-sectional view of the electronic panel EP corresponding to one pixel shown in FIG. 7.

Referring to FIG. 8, the pixel PX may include a transistor TR and a light emitting element OLED. The light emitting element OLED may include a first electrode (e.g., an anode) AE, a second electrode (e.g., a cathode) CE, a hole control layer HCL, an electron control layer ECL, and a light emitting layer EML.

The transistor TR and the light emitting element OLED may be disposed on the substrate SUB. As an example, one transistor TR is illustrated in FIG. 8, but the present disclosure is not limited thereto, and the pixel PX may include a plurality of transistors and at least one capacitor to drive the light emitting element OLED.

The display area DA may include a light emitting area PA corresponding to each pixel PX, and a non-light-emitting area NPA around (e.g., adjacent to) the light emitting area PA. The light emitting element OLED may be disposed in the light emitting area PA.

A buffer layer BFL may be disposed on the substrate SUB, and the buffer layer BFL may be an inorganic layer. A semiconductor pattern may be disposed on the buffer layer BFL. The semiconductor pattern may include polycrystalline silicon, amorphous silicon, or a metal oxide.

The semiconductor pattern may be doped with an N-type dopant or a P-type dopant. The semiconductor pattern may include a high-doped region and a low-doped region. The high-doped region may have a conductivity greater than that of the low-doped region, and may serve or substantially serve as a source electrode and a drain electrode of the transistor TR. The low-doped region may correspond to or substantially correspond to an active (or a channel) of the transistor TR.

A source S, an active A, and a drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE may include a first connection electrode CNE1 and a second connection electrode CNE2 to connect the transistor TR to the light emitting element OLED. The first connection electrode CNE1 may be disposed on the third insulating layer INS3, and may be connected to the drain D via a first contact hole CH1 defined through (e.g., penetrating) the first, second, and third insulating layers INS1, INS2, and INS3.

A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be connected to the first connection electrode CNE1 via a second contact hole CH2 defined through (e.g., penetrating) the fourth insulating layer INS4 and the fifth insulating layer INS5.

A sixth insulating layer INS6 may be disposed on the second connection electrode CNE2. Each of the layers from the buffer layer BFL to the sixth insulating layer INS6 may be defined as the circuit element layer DP-CL. Each of the first to sixth insulating layers INS1 to INS6 may be an inorganic layer or an organic layer.

The first electrode AE may be disposed on the sixth insulating layer INS6. The first electrode AE may be connected to the second connection electrode CNE2 via a third contact hole CH3 defined through (e.g., penetrating) the sixth insulating layer INS6. A pixel definition layer PDL may be disposed on the first electrode AE and the sixth insulating layer INS6. The pixel definition layer PDL may be provided with an opening PX_OP defined therethrough to expose a portion of the first electrode AE.

The hole control layer HCL may be disposed on the first electrode AE and the pixel definition layer PDL. The hole control layer HCL may include a hole transport layer and a hole injection layer.

The light emitting layer EML may be disposed on the hole control layer HCL. The light emitting layer EML may be disposed in an area corresponding to the opening PX_OP. The light emitting layer EML may include an organic material and/or an inorganic material. The light emitting layer EML may generate light having one of red, green, and/or blue colors.

The electron control layer ECL may be disposed on the light emitting layer EML and the hole control layer HCL. The electron control layer ECL may include an electron transport layer and an electron injection layer. The hole control layer HCL and the electron control layer ECL may be commonly disposed in the light emitting area PA and the non-light-emitting area NPA.

The second electrode CE may be disposed on the electron control layer ECL. The second electrode CE may be commonly disposed over the pixels PX. A layer at (e.g., in or on) which the light emitting element OLED is disposed may be referred to as the display element layer DP-OLED.

The thin film encapsulation layer TFE may be disposed on the second electrode CE to cover the pixels PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may include an inorganic insulating layer, and may protect the pixel PX from moisture and oxygen. The second encapsulation layer EN2 may include an organic insulating layer, and may protect the pixel PX from foreign substances, such as dust particles.

A first voltage may be applied to the first electrode AE via the transistor TR, and a second voltage having a voltage level lower than that of the first voltage may be applied to the second electrode CE. Holes and electrons injected into the light emitting layer EML may be recombined with each other to generate excitons, and the light emitting element OLED may emit light by the excitons returning to a ground state from an excited state.

The input sensing part ISP may be disposed on the thin film encapsulation layer TFE. The input sensing part ISP may be directly manufactured on the upper surface of the thin film encapsulation layer TFE.

A base layer BS may be disposed on the thin film encapsulation layer TFE. The base layer BS may include an inorganic insulating layer. At least one inorganic insulating layer may be provided on the thin film encapsulation layer TFE as the base layer BS.

The input sensing part ISP may include a first conductive pattern CTL1, and a second conductive pattern CTL2 disposed on the first conductive pattern CTL1. The first conductive pattern CTL1 may be disposed on the base layer BS. An insulating layer TINS may be disposed on the base layer BS to cover the first conductive pattern CTL1. The insulating layer TINS may include an inorganic insulating layer or an organic insulating layer. The second conductive pattern CTL2 may be disposed on the insulating layer TINS.

The first and second conductive patterns CTL1 and CTL2 may overlap with the non-light-emitting area NPA. The first and second conductive patterns CTL1 and CTL2 may be disposed in the non-light-emitting area NPA between the light emitting areas PA, and may have a mesh shape.

The first and second conductive patterns CTL1 and CTL2 may form the sensors of the input sensing part ISP. As an example, the first and second conductive patterns CTL1 and CTL2 having the mesh shape may be spaced apart (e.g., separated) from each other in a suitable area (e.g., a predetermined area) to form the sensors. A portion of the second conductive pattern CTL2 may be connected to the first conductive pattern CTL1.

The anti-reflective layer RPL may be disposed on the second conductive pattern CTL2. The anti-reflective layer RPL may include a black matrix BM and a plurality of color filters CF. The black matrix BM may overlap with the non-light-emitting area NPA. The color filters CF may overlap with the light emitting areas PA, respectively.

The black matrix BM may be disposed on the insulating layer TINS to cover the second conductive pattern CTL2. The black matrix BM may be provided with an opening B_OP defined therethrough to overlap with the light emitting area PA and the opening PX_OP. The black matrix BM may absorb and block light. A width of the opening B_OP of the black matrix BM may be greater than a width of the opening PX_OP of the pixel definition layer PDL.

The color filters CF may be disposed on the insulating layer TINS and the black matrix BM. The color filters CF may be disposed in the openings B_OP, respectively. A planarization insulating layer PINS may be disposed on the color filters CF. The planarization insulating layer PINS may provide a flat or substantially flat upper surface.

In a case where the external light incident to the display panel DP is provided to the user after being reflected by the display panel DP, like a mirror, the user may perceive the external light. The anti-reflective layer RPL may include the color filters CF that display the same or substantially the same colors as those of the pixels to prevent or substantially prevent the external light incident to the display panel DP from being reflected to be perceived by the user. The color filters may filter the external light to have the same or substantially the same colors as those of the pixels. In this case, the external light may not be perceived by the user.

However, the present disclosure is not limited thereto or thereby, and the anti-reflective layer RPL may include a polarizing film to reduce the reflectance of the external light. The polarizing film may be attached to the input sensing part ISP by an adhesive layer after being manufactured separately. The polarizing film may include a retarder and/or a polarizer.

Figure 9A:
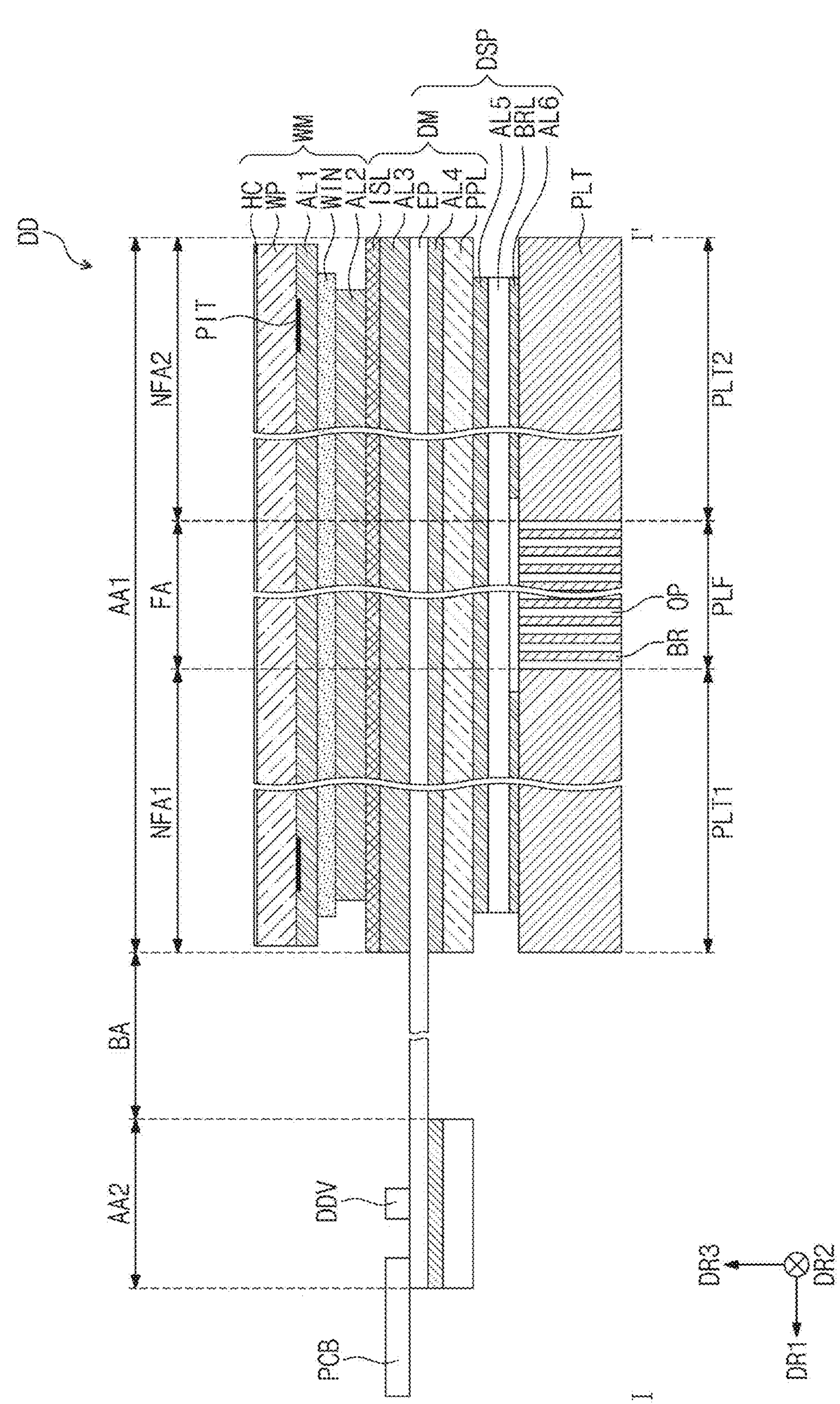
FIG. 9A is a cross-sectional view taken along the line I-I' of FIG. 7.
Figure 9B:
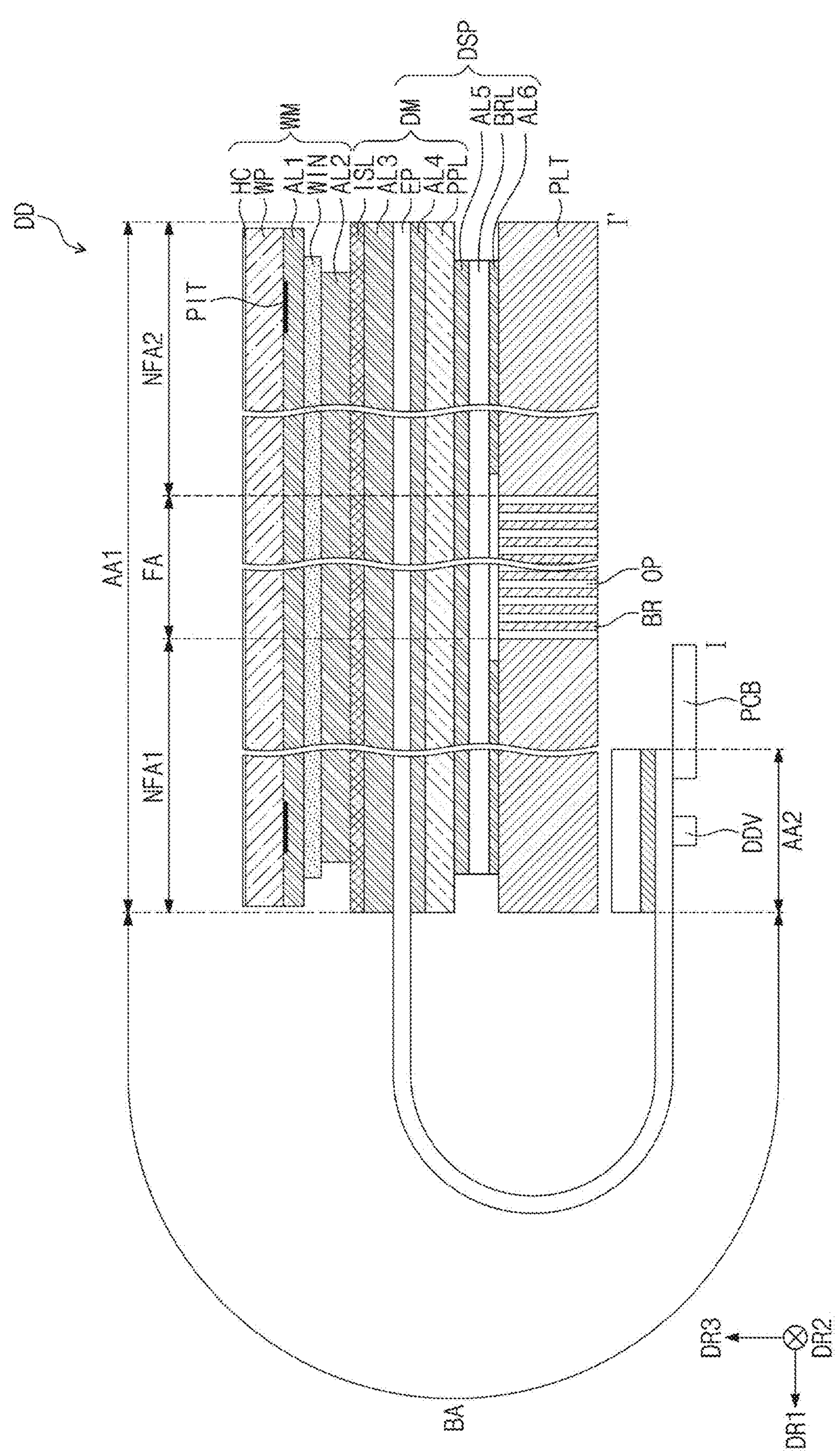
FIG. 9B is a view illustrating a bent state of a bending area shown in FIG. 9A.

FIG. 9A is a cross-sectional view taken along the line I-I' of FIG. 7. FIG. 9B is a view illustrating a bent state of a bending area shown in FIG. 9A.

FIG. 9A shows a portion of a display part DSP, a portion of a support plate PLT, and a portion of the window module WM as a representative example.

Referring to FIG. 9A, the display device DD may include the display part DSP, the window module WM disposed on the display part DSP, and the support plate PLT disposed under the display part DSP. The support plate PLT may support the display module DM. The window module WM may include a window WIN, a window protective layer WP, a hard coating layer HC, and first and second adhesive layers AL1 and AL2.

The display part DSP may include the electronic panel EP, an impact absorbing layer ISL, the panel protective layer PPL, a barrier layer BRL, and third, fourth, fifth, and sixth adhesive layers AL3, AL4, AL5, and AL6. The impact absorbing layer ISL, the electronic panel EP, the panel protective layer PPL, the third adhesive layer AL3, and the fourth adhesive layer AL4 may be defined as the display module DM. Because the configurations of the electronic panel EP and the panel protective layer PPL may be the same or substantially the same as those described above with reference to FIG. 5, redundant description may not be repeated.

The impact absorbing layer ISL may be disposed on the electronic panel EP. The impact absorbing layer ISL may absorb external impacts applied to the electronic panel EP from above the display device DD, and may protect the electronic panel EP. The impact absorbing layer ISL may be manufactured in the form of a stretched film.

The impact absorbing layer ISL may include a flexible plastic material. The flexible plastic material may be defined as a synthetic resin film. As an example, the impact absorbing layer ISL may include the flexible plastic material, such as polyimide (PI) or polyethylene terephthalate (PET).

The window WIN may be disposed on the impact absorbing layer ISL. The window WIN may protect the electronic panel EP from external scratches. The window WIN may have an optically transparent property. The window WIN may include a glass material, but the present disclosure is not limited thereto or thereby. According to an embodiment, the window WIN may include a synthetic resin film.

The window WIN may have a single-layer or multi-layered structure. As an example, the window WIN may include a plurality of synthetic resin films that are attached to each other by an adhesive or a glass substrate, and/or a synthetic resin film attached to the glass substrate by an adhesive.

The window protective layer WP may be disposed on the window WIN. The window protective layer WP may include the flexible plastic material, such as polyimide (PI) or polyethylene terephthalate (PET). The hard coating layer HC may be disposed on the window protective layer WP.

A print layer PIT may be disposed on a lower surface of the window protective layer WP. The print layer PIT may have a black color, but the present disclosure is not limited thereto, and the color of the print layer PIT is not limited to the black color. The print layer PIT may be disposed adjacent to an edge of the window protective layer WP.

The barrier layer BRL may be disposed under the panel protective layer PPL. The barrier layer BRL may increase a resistance to a compressive force that may be caused by an external pressure. Accordingly, the barrier layer BRL may prevent or substantially prevent the electronic panel EP from being deformed. The barrier layer BRL may include the flexible plastic material, such as polyimide or polyethylene terephthalate.

The barrier layer BRL may have a suitable color that absorbs light. As an example, the barrier layer BRL may have a black color. In this case, when looking at the display module DM from an upper side of the display module DM, the components disposed under the barrier layer BRL may not be viewed by the user.

The first adhesive layer AL1 may be disposed between the window protective layer WP and the window WIN. The window protective layer WP may be attached to the window WIN by the first adhesive layer AL1. The first adhesive layer AL1 may cover the print layer PIT.

The second adhesive layer AL2 may be disposed between the window WIN and the impact absorbing layer ISL. The window WIN may be attached to the impact absorbing layer ISL by the second adhesive layer AL2.

The third adhesive layer AL3 may be disposed between the impact absorbing layer ISL and the electronic panel EP. The impact absorbing layer ISL may be attached to the electronic panel EP by the third adhesive layer AL3.

The fourth adhesive layer AL4 may be disposed between the electronic panel EP and the panel protective layer PPL. The electronic panel EP may be attached to the panel protective layer PPL by the fourth adhesive layer AL4.

The fifth adhesive layer AL5 may be disposed between the panel protective layer PPL and the barrier layer BRL. The panel protective layer PPL may be attached to the barrier layer BRL by the fifth adhesive layer AL5.

The sixth adhesive layer AL6 may be disposed between the barrier layer BRL and the support plate PLT. The support plate PLT may be disposed under the barrier layer BRL, and the sixth adhesive layer AL6 may be disposed between the barrier layer BRL and the support plate PLT. The barrier layer BRL may be attached to the support plate PLT by the sixth adhesive layer AL6.

The sixth adhesive layer AL6 may overlap with the first and second non-folding areas NFA1 and NFA2, and may not overlap with the folding area FA. In other words, the sixth adhesive layer AL6 may not be disposed in the folding area FA.

The first to sixth adhesive layers AL1 to AL6 may include a transparent adhesive, such as a pressure sensitive adhesive (PSA) or an optically clear adhesive (OCA). However, the present disclosure is not limited thereto, and the kinds of the adhesive are not particularly limited.

The panel protective layer PPL may have a thickness smaller than a thickness of the window protective layer WP. The barrier layer BRL may have a thickness smaller than the thickness of the panel protective layer PPL. The electronic panel EP may have a thickness smaller than the thickness of the barrier layer BRL, and equal to or substantially equal to a thickness of the window WIN. The impact absorbing layer ISL may have a thickness smaller than the thickness of the electronic panel EP.

The first adhesive layer AL1 may have a thickness equal to or substantially equal to the thickness of the barrier layer BRL. Each of the second adhesive layer AL2 and the third adhesive layer AL3 may have a thickness equal to or substantially equal to the thickness of the panel protective layer PPL. The fourth adhesive layer AL4 may have a thickness equal to or substantially equal to a thickness of the fifth adhesive layer AL5.

Each of the fourth adhesive layer AL4 and the fifth adhesive layer AL5 may have the thickness smaller than the thickness of the electronic panel EP, and greater than the thickness of the impact absorbing layer ISL. A thickness of the sixth adhesive layer AL6 may be smaller than the thickness of the impact absorbing layer ISL. The hard coating layer HC may have a thickness smaller than the thickness of the sixth adhesive layer AL6.

The electronic panel EP, the impact absorbing layer ISL, the panel protective layer PPL, and the third and fourth adhesive layers AL3 and AL4 may have the same or substantially the same width as each other. The window protective layer WP and the first adhesive layer AL1 may have the same or substantially the same width as each other. The barrier layer BRL and the fifth and sixth adhesive layers AL5 and AL6 may have the same or substantially the same width as each other.

The widths of the electronic panel EP, the impact absorbing layer ISL, the panel protective layer PPL, and the third and fourth adhesive layers AL3 and AL4 may be greater than the widths of the window protective layer WP and the first adhesive layer AL1. Edges of the electronic panel EP, the impact absorbing layer ISL, the panel protective layer PPL, and the third and fourth adhesive layers AL3 and AL4 may be disposed outside of edges of the window protective layer WP and the first adhesive layer AL1.

Widths of the window WIN and the second adhesive layer AL2 may be smaller than the widths of the window protective layer WP and the first adhesive layer AL1. The width of the second adhesive layer AL2 may be smaller than the width of the window WIN. An edge of the window WIN may be disposed inside the edges of the window protective layer WP and the first adhesive layer AL1. An edge of the second adhesive layer AL2 may be disposed inside the edge of the window WIN.

The widths of the barrier layer BRL and the fifth and sixth adhesive layers AL5 and AL6 may be smaller than the widths of the window protective layer WP and the first adhesive layer AL1. Edges of the barrier layer BRL and the fifth and sixth adhesive layers AL5 and AL6 may be disposed inside the edges of the window protective layer WP and the first adhesive layer AL1.

The support plate PLT may be disposed under the display part DSP, and may support the display part DSP. The support plate PLT may be disposed under the electronic panel EP, and may support the electronic panel EP.

A width of the support plate PLT may be the same or substantially the same as the width of the electronic panel EP. The support plate PLT may have a rigidity higher than that of the display part DSP.

The support plate PLT may include a non-metallic material. As an example, the support plate PLT may include a fiber reinforced composite. The fiber reinforced composite may include a carbon fiber reinforced plastic (CFRP) or a glass fiber reinforced plastic (GFRP).

Because the support plate PLT includes the fiber reinforced composite, the support plate PLT may be lightweight. For example, as the support plate PLT includes the fiber reinforced composite, the support plate PLT may have a light weight compared with that of a metal support plate formed of a metal material, and may have a modulus and strength similar to those of the metal support plate.

In addition, because the support plate PLT includes the fiber reinforced composite, a shape machining process for the support plate PLT may be performed more easier compared with that of the metal support plate. As an example, the support plate PLT including the fiber reinforced composite may be easily processed by using a laser process or a micro-blast process.

However, the present disclosure is not limited thereto, and according to an embodiment, the support plate PLT may include a metal material.

The support plate PLT may include a first non-folding portion PLT1, a folding portion PLF, and a second non-folding portion PLT2. The first non-folding portion PLT1 may overlap with the first non-folding area NFA1. The folding portion PLF may overlap with the folding area FA. The second non-folding portion PLT2 may overlap with the second non-folding area NFA2.

A plurality of openings OP may be defined through the folding portion PLF. The openings OP may be formed through a portion of the support plate PLT in the third direction DR3. When viewed in the second direction DR2 (e.g., in a cross-sectional view), the openings OP may be arranged to be spaced apart from each other along the first direction DR1. The openings OP may be formed by the laser process or the micro-blast process. A width of the portion through which the openings OP are formed may be smaller than a width of the opening defined through the sixth adhesive layer AL6.

As the openings OP are defined through the portion of the support plate PLT overlapping with the folding area FA, a flexibility of the portion of the support plate PLT overlapping with the folding area FA may be increased. As a result, the support plate PLT may be folded with respect to the folding area FA.

The folding portion PLF may include branches BR. The branches BR may be disposed between the openings OP that are adjacent to each other in the first direction DR1. The openings OP and the branches BR will be described in more detail below with reference to FIGS. 10A to 10C.

In some embodiments, the display device DD may further include a digitizer, a shielding layer, and a heat dissipation layer, which may be disposed under the support plate PLT.

Referring to FIG. 9B, the panel protective layer PPL and the fourth adhesive layer AL4 may not be disposed in the bending area BA. The panel protective layer PPL and the fourth adhesive layer AL4 may be disposed in the second area AA2 under the electronic panel EP. The data driver DDV may be disposed in the second area AA2 under the electronic panel EP.

The printed circuit board PCB may be connected to the second area AA2 of the electronic panel EP. The printed circuit board PCB may be connected to one side of the second area AA2 of the electronic panel EP. The bending area BA may be bent, and the second area AA2 may be disposed under the first area AA1. Accordingly, the data driver DDV and the printed circuit board PCB may be disposed under the first area AA1.

Figure 10A:
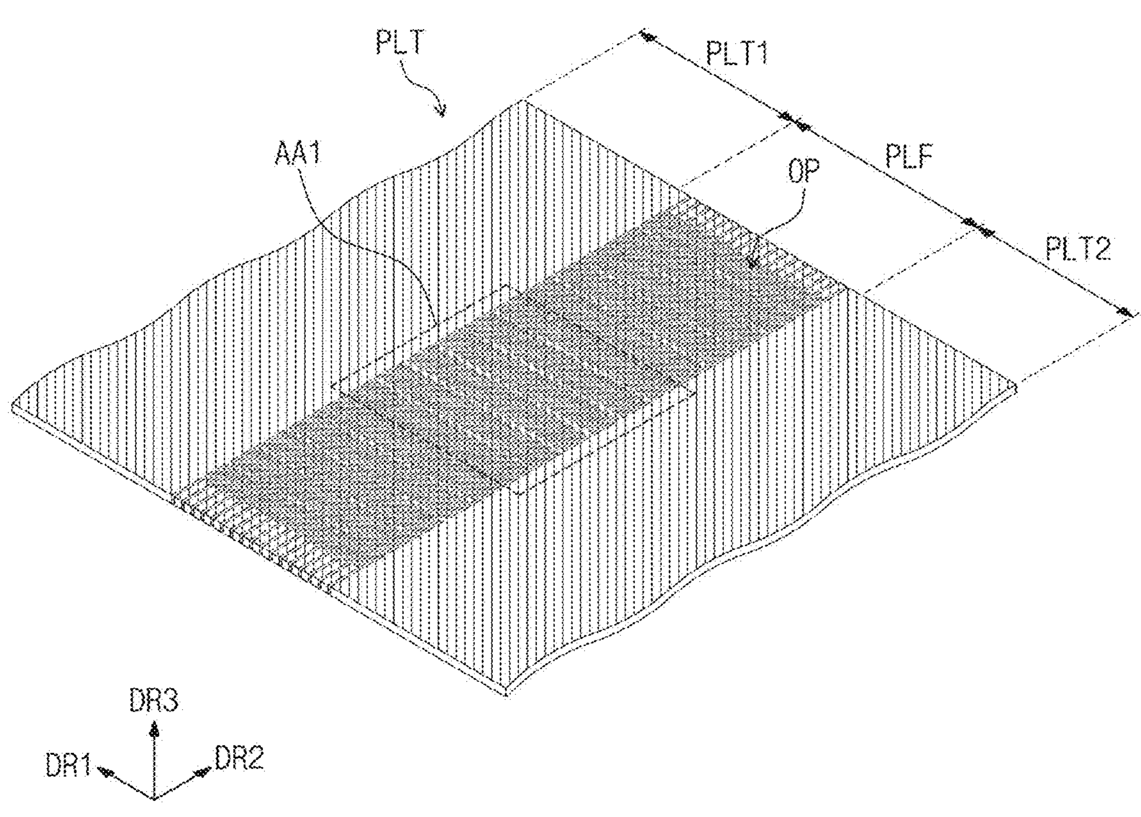
FIG. 10A is a perspective view of a support plate shown in FIG. 9A.
Figure 10B:
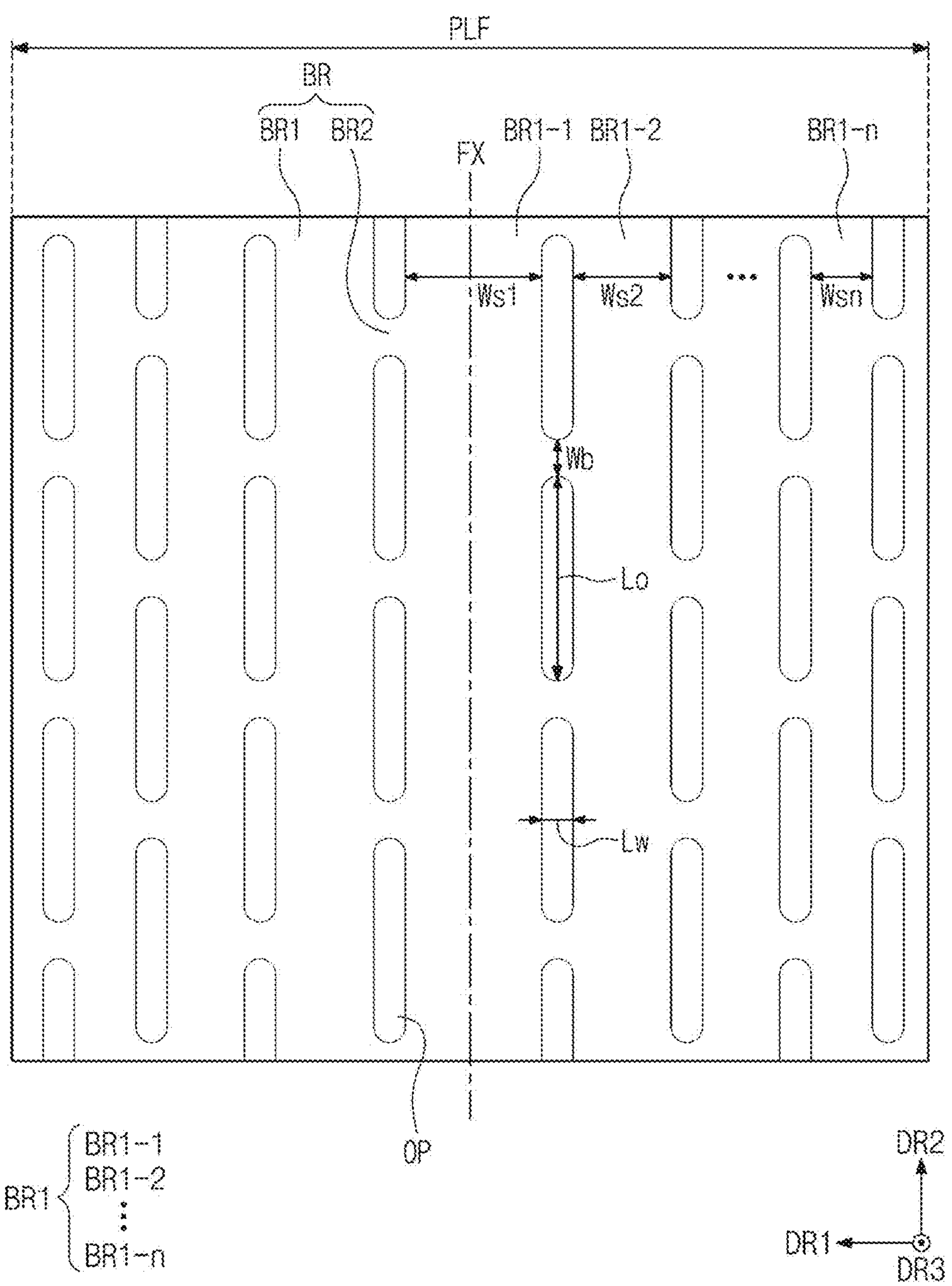
FIG. 10B is an enlarged view of a folding portion shown in FIG. 10A.
Figure 10C:
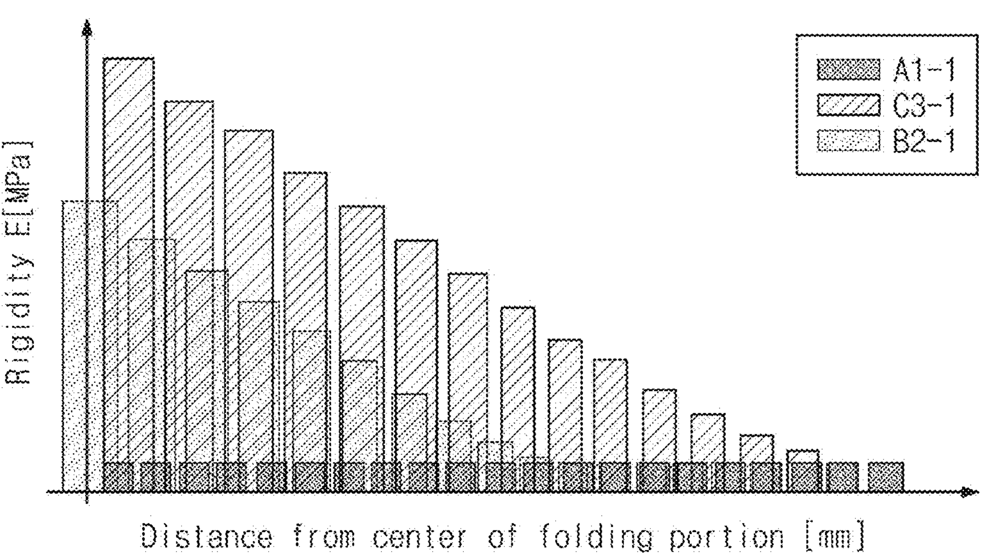
FIG. 10C is a graph illustrating a variation in a rigidity according to a position in the folding portion shown in FIG. 10A.
Figure 10D:
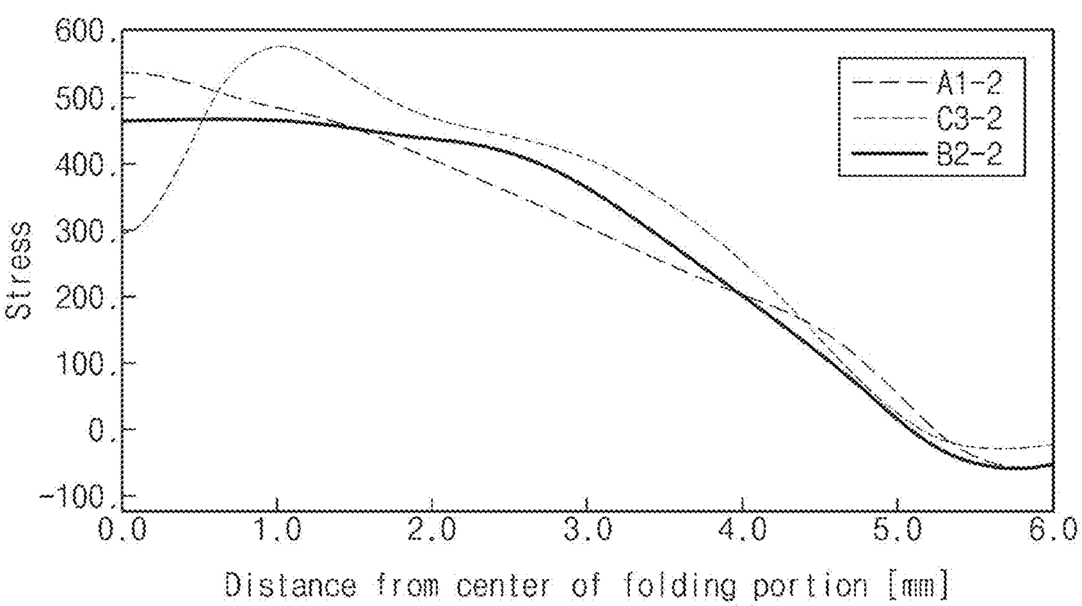
FIG. 10D is a graph illustrating stress applied to a window module shown in FIG. 9A when the window module is folded.

FIG. 10A is a perspective view of the support plate PLT shown in FIG. 9A. FIG. 10B is an enlarged view of the folding portion PLF shown in FIG. 10A. FIG. 10C is a graph illustrating a variation in a rigidity according to a position in the folding portion PLF shown in FIG. 10A. FIG. 10D is a graph illustrating stress applied to the window module WM shown in FIG. 9A when the window module WM is folded.

As an example, FIG. 10B is an enlarged plan view of the first area AA1 shown in FIG. 10A.

Because the folding axis FX shown in FIG. 10B is the same or substantially the same as the folding axis FX shown in FIGS. 2A and 2B, redundant description of the folding axis FX may not be repeated or may be simplified.

Referring to FIG. 10A, when viewed in the plane (e.g., in a plan view), the support plate PLT may have a rectangular shape defined by short sides extending in the first direction DR1 and long sides extending in the second direction DR2, but the present disclosure is not limited thereto. According to other embodiments, the support plate PLT may have a variety of suitable shapes.

The support plate PLT may include the first non-folding portion PLT1, the folding portion PLF, and the second non-folding portion PLT2. The folding portion PLF may be disposed between the first non-folding portion PLT1 and the second non-folding portion PLT2. The first non-folding portion PLT1, the folding portion PLF, and the second non-folding portion PLT2 may be arranged along a direction parallel to or substantially parallel to the first direction DR1. The first non-folding portion PLT1 and the second non-folding portion PLT2 may respectively overlap with the first non-folding area NFA1 and the second non-folding area NFA2 shown in FIGS. 7 and 9A. The folding portion PLF may overlap with the folding area FA shown in FIGS. 7 and 9A.

As an example, each of the first non-folding portion PLT1 and the second non-folding portion PLT2 may have a quadrangular shape that is parallel to or substantially parallel to a plane defined by the first direction DR1 and the second direction DR2, but the present disclosure is not limited thereto or thereby. According to other embodiments, each of the first and second non-folding portions PLT1 and PLT2 may have a variety of suitable shapes.

A grid pattern may be defined in the folding portion PLF. As an example, the openings OP may be defined through (e.g., may penetrate) the folding portion PLF. The openings OP may be arranged in a suitable rule (e.g., a predetermine rule). The openings OP may be arranged in a grid shape, and thus, the grid pattern may be formed in the folding portion PLF.

Referring to FIG. 10B, the openings OP may be arranged along the first direction DR1 and the second direction DR2. When viewed in the plane (e.g., in a plan view), the openings OP that are adjacent to each other in the first direction DR1 may be arranged to be staggered with each other.

The openings OP may extend longer in the second direction DR2 than in the first direction DR1. In other words, the openings OP may extend in a direction parallel to or substantially parallel to the folding axis FX.

The folding portion PLF may include the branches BR. The folding portion PLF may include first branches BR1 disposed between the openings OP that are adjacent to each other in the first direction DR1, and second branches BR2 disposed between the openings OP that are adjacent to each other in the second direction DR2. The first branches BR1 may extend in the second direction DR2, and the second branches BR2 may extend in the first direction DR1. The second branches BR2 may connect the first branches BR1 that are adjacent to each other in the first direction DR1 to each other. The openings OP may be defined by the first and second branches BR1 and BR2.

The folding axis FX may overlap with a center of the folding portion PLF. The folding axis FX may overlap with one of the first branches BR1. The one of the first branches BR1 may extend in the second direction DR2 along the folding axis FX. The folding axis FX may not overlap with the openings OP.

The first branches BR1 may include a first-first branch portion BR1-1 to a first-nth branch portion BR1-*n*. Here, n may be a natural number. The first-first branch portion BR1-1 to the first-nth branch portion BR1-*n* may extend in the second direction DR2, and may be arranged along the direction parallel to or substantially parallel to the first direction DR1. The first-first branch portion BR1-1 may overlap with the folding axis FX. The first-nth branch portion BR1-*n* may be disposed adjacent to the first and second non-folding portions PLT1 and PLT2 shown in FIG. 10A. Because the folding portion PLF may have a shape that is symmetrical or substantially symmetrical in the first direction DR1 with respect to the folding axis FX, for convenience, a part of the folding portion PLF disposed at a right side of the folding axis FX will be mainly described in more detail hereinafter.

When viewed in the plane (e.g., in a plan view), a length in the first direction DR1 of the first branches BR1 that are adjacent to each other may be varied. When viewed in the plane (e.g., in a plan view), as a distance from the folding axis FX in the direction parallel to or substantially parallel to the first direction DR1 increases, the length in the first direction DR1 of the first branches BR1 may be decreased.

A length Ws1 in the first direction DR1 of the first-first branch portion BR1-1 overlapping with the folding axis FX may be greater than a length Ws2 in the first direction DR1 of the first-second branch portion BR1-2. The length Ws2 in the first direction DR1 of the first-second branch portion BR1-2 may be greater than a length Wsn in the first direction DR1 of the first-nth branch portion BR1-*n*. In other words, from among the first branches BR1, the length Ws1 in the first direction DR1 of the first-first branch portion BR1-1 closest to the folding axis FX may be the largest length, and the length in the first direction DR1 of the first-nth branch portion BR1-*n* spaced farthest apart from the folding axis FX may be the smallest length.

According to the present structure, when viewed in the plane (e.g., in a plan view), an area of the first branches BR1 between the openings OP that are adjacent to each other in the first direction DR1 may decrease as a distance from the folding axis FX increases.

When viewed in the plane (e.g., in a plan view), an area of the first-first branch portion BR1-1 overlapping with the folding axis FX may be greater than an area of the first-second branch portion BR1-2. The area of the first-second branch portion BR1-2 may be greater than an area of the first-nth branch portion BR1-*n*. In other words, from among the first branches BR1, the first-first branch portion BR1-1 closest to the folding axis FX may have the largest area, and the first-nth branch portion BR1-*n* farthest from the folding axis FX may have the smallest area.

When viewed in the plane (e.g., in a plan view), a ratio of the area of the openings OP to the area of the branches BR that are adjacent to each of the openings OP in the first and second directions DR1 and DR2 may be varied. The area ratio of the openings OP to the first and second branches BR1 and BR2 may increase starting from the center of the folding portion PLF to the first and second non-folding portions PLT1 and PLT2. The center of the folding portion PLF may be defined as a portion of the folding portion PLF that overlaps with the folding axis FX.

Referring to FIGS. 10B, 10C, and 10D, because the area ratio of the openings OP to the branches BR that are adjacent to the openings OP increases as the distance from the folding axis FX or the center of the folding portion PLF increases, the rigidity of the folding portion PLF may be varied depending on a position in the folding portion PLF. The rigidity may be inversely proportional to the area ratio of the openings OP to the branches BR that are adjacent to the openings OP. As the distance from the folding axis FX increases, the rigidity of the folding portion PLF may decrease. In other words, from among the first branches BR1, the first-first branch portion BR1-1 overlapping with the folding axis FX may have the largest rigidity, and the first-nth branch portion BR1-*n* farthest from the folding axis FX may have the smallest rigidity.

In more detail, a first-first graph A1-1 shows a variation of the rigidity of the folding portion PLF according to the distance from the center of the folding portion PLF in a case where the area of the first branches BR1 between the openings OP that are adjacent to each other is uniform. A first-second graph A1-2 shows stress applied to the window module WM according to the distance from the center of the folding portion PLF in the case where the area of the first branches BR1 between the openings OP that are adjacent to each other is uniform.

A second-first graph B2-1 shows a variation of the rigidity of the folding portion PLF according to the distance from the center of the folding portion PLF in a case where the folding axis FX overlaps with the first branch BR1, and the area of the first branches BR1 between the openings OP that are adjacent to each other decreases as the distance from the folding axis FX increases. A second-second graph B2-2 shows stress applied to the window module WM according to the distance from the center of the folding portion PLF in the case where the folding axis FX overlaps with the first branch BR1, and the area of the first branches BR1 between the openings OP that are adjacent to each other decreases as the distance from the folding axis FX increases.

A third-first graph C3-1 shows a variation of the rigidity of the folding portion PLF according to the distance from the center of the folding portion PLF in a case where the folding axis FX overlaps with the openings OP, and the area of the first branches BR1 between the openings OP that are adjacent to each other decreases as the distance from the folding axis FX increases. A third-second graph C3-2 shows stress applied to the window module WM according to the distance from the center of the folding portion PLF in the case where the folding axis FX overlaps with the openings OP, and the area of the first branches BR1 between the openings OP that are adjacent to each other decreases as the distance from the folding axis FX increases.

When the support plate PLT is folded, the window module WM (e.g., refer to FIG. 9A) disposed on the support plate PLT may be folded. When the window module WM (e.g., refer to FIG. 9A) is folded, stress may be applied to the window module WM. The largest stress may be applied to a center of the support plate PLT and a center of the window module WM overlapping with the folding axis FX. The smallest stress may be applied to a portion of the window module WM spaced farthest apart from the folding axis FX.

When comparing the first-first graph A1-1 with the second-first graph B2-1, and when comparing the first-second graph A1-2 with the second-second graph B2-2, even though the distance from the folding axis FX increases, the rigidity of the folding portion PLF shown by the first-first graph A1-1 may be uniform. However, in the case of the second-first graph B2-1, the rigidity at a point overlapping with the folding axis FX may be the largest, and the rigidity of the folding portion PLF may decrease as the distance from the folding axis FX increases. As the rigidity of the folding portion is higher in the embodiment showing the result of the second-first graph B2-1 than in the embodiment showing the result of the first-first graph B1-1, a resistance of the folding portion PLF against an external force may increase in the embodiment showing the result of the second-first graph B2-1.

Accordingly, an amount in the variation of the folding portion PLF with respect to the external force may decrease, and an amount in variations of the display module DM and the window module WM, which is disposed on the support plate PLT and in contact with the upper surface of the folding portion PLF, with respect to the external force may decrease. As the amount in the variation of the window module WM with respect to the external force decreases, the stress applied to the window module WM may decrease.

In more detail, the stress applied to the center of the window module WM in the embodiment of the second-second graph B2-2 may decrease more compared with the stress in the embodiment of the first-second graph A1-2. Accordingly, when the electronic device ED (e.g., refer to FIG. 1) is folded, the window module WM may be prevented or substantially prevented from being damaged.

In addition, when comparing the second-first graph B2-1 with the third-first graph C3-1, and when comparing the second-second graph B2-2 with the third-second graph C3-2, the rigidity of the center of the folding portion PLF that is adjacent to the folding axis FX in the embodiment of the third-first graph C3-1 may be greater than the rigidity of the center of the folding portion PLF adjacent to the folding axis FX in the embodiment of the second-first graph B2-1. The stress applied to the center of the window module WM of the third-second graph C3-2 may be smaller than the stress applied to the center of the window module WM of the second-second graph B2-2.

However, according to the embodiment of the third-second graph C3-2, a stress value may be high at a point spaced apart from the center of the folding portion PLF by a distance (e.g., a predetermined distance). The stress value of the embodiment of the third-second graph C3-2 at the point spaced apart from the center of the folding portion PLF by the distance may be greater than the stress value of the embodiment of the second-second graph B2-2 at the point spaced apart from the center of the folding portion PLF by the distance. Therefore, the stress may be strongly applied to the window module WM at the point spaced apart from the center of the folding portion PLF by the distance, and thus, the window module WM may be damaged.

In the support plate PLT according to one or more embodiments of the present disclosure, the folding axis FX may overlap with the first branches BR1. As the distance from the center of the folding portion PLF increases, the stress applied to the window module WM may decrease. Accordingly, a possibility of damage to the window module WM may decrease.

The stress applied to the window module WM has been described with reference to FIG. 10D as a representative example, but the present disclosure is not limited thereto or thereby, and the stress applied to the other layers disposed on an upper or lower portion of the support plate PLT may also decrease, and thus, a possibility of damage to the other layers may also be reduced.

Referring to FIG. 10B, a width Wb in the second direction DR2 of the second branches BR2 may be uniform or substantially uniform. A length Lw in the first direction DR1 of each of the openings OP may be uniform or substantially uniform. A length Lo in the second direction DR2 of each of the openings OP may be uniform or substantially uniform.

In the embodiment illustrated in FIG. 10B, the area ratio of the openings OP to the branches BR that are adjacent to the openings OP is varied as the length in the first direction DR1 of the first branches BR1 is varied, but the present disclosure is not limited thereto or thereby. The area between the openings OP that are adjacent to each other may be varied as the length in the second direction DR2 of the second branches BR2 or the area of the openings OP is varied. This will be described in more detail below with reference to FIGS. 11 to 17.

Figure 11:
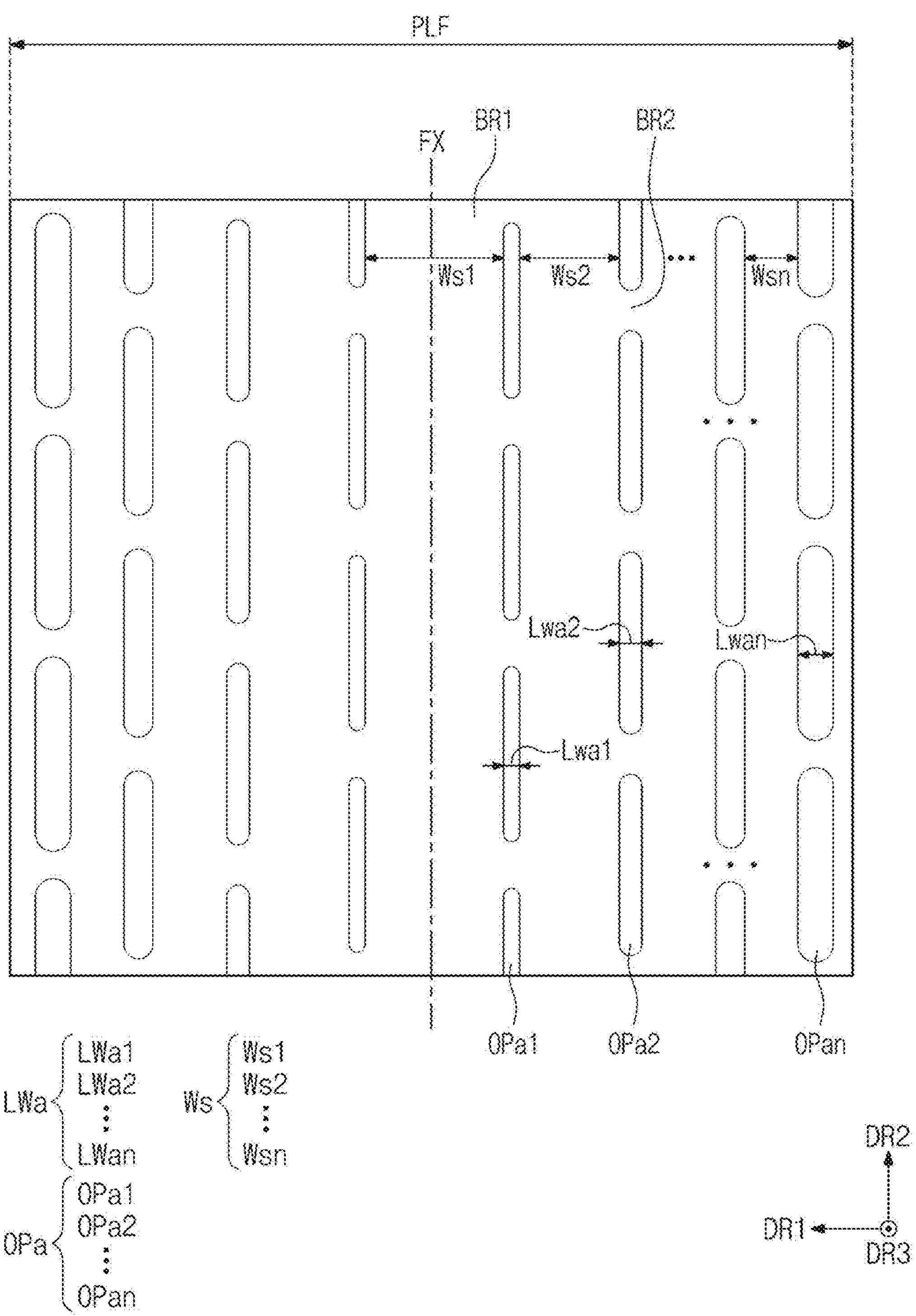
FIG. 11 is a plan view of a folding portion according to an embodiment of the present disclosure.

FIG. 11 is a plan view of a folding portion according to an embodiment of the present disclosure.

The first branches BR1, the second branches BR2, and the folding axis FX illustrated in FIG. 11 are the same or substantially the same as the first branches BR1, the second branches BR2, and the folding axis FX described above with reference to FIG. 10B, and thus, redundant description may not be repeated or may be simplified.

The folding portion PLF may have a shape symmetrical or substantially symmetrical in the first direction DR1 with respect to the folding axis FX. Hereinafter, for convenience, the first branches BR1, the second branches BR2, and openings OPa, which are disposed at a right side of the folding axis FX, will be described in more detail, and redundant description of those at the left side of the folding axis FX may not be repeated.

Referring to FIGS. 9A, 10A, and 11, a length Ws in the first direction DR1 of the first branches BR1 may be decreased as a distance from the folding axis FX increases. A length in the second direction DR2 of the second branches BR2 may be uniform or substantially uniform. A length in the second direction DR2 of the openings OPa may be uniform or substantially uniform.

A length in the first direction DR1 of the openings OPa may be increased as the distance from the folding axis FX increases. As an example, from among the first, second, . . . , n-th columns sequentially arranged from the folding axis FX to the direction parallel to or substantially parallel to the first direction DR1, a length Lwa1 in the first direction DR1 of openings OPa1 arranged in the first column may be smaller than a length Lwa2 in the first direction DR1 of openings OPa2 arranged in the second column. The length Lwa2 in the first direction DR1 of the openings OPa2 arranged in the second column may be smaller than a length in the first direction DR1 of openings OPan arranged in the n-th column. Here, n may be a natural number. The column may correspond to the second direction DR2.

In other words, from among the openings OPa, the length Lwa1 in the first direction DR1 of the openings OPa1 closest to the folding axis FX may be the smallest length. From among the openings OPa, the length Lwan in the first direction DR1 of the openings OPan adjacent to one side of the first and second non-folding portions PLT1 and PLT2 may be the largest length. The one side of the first and second non-folding portions PLT1 and PLT2 may face the folding portion PLF.

Accordingly, when viewed in the plane (e.g., in a plan view), the area of the openings OPa may increase as the distance from the folding axis FX increases. The area of the openings OPa adjacent to the folding axis FX may be the smallest area at the center of the folding portion PLF, and the area of the openings OPa may increase as the distance from the first and second non-folding portions PLT1 and PLT2 decreases.

As a length in the first direction DR1 of the first branches BR1 and the area of the openings OPa are varied, an area ratio of the openings OPa to the branches BR adjacent to the openings OPa may be varied. The area ratio of the openings OPa to the branches BR adjacent to the openings OPa may increase as the distance from the folding axis FX increases. Accordingly, the rigidity of the folding portion PLF may be changed. The rigidity of the folding portion PLF may increase as the distance from the folding axis FX decreases.

Because the rigidity of the folding portion PLF increases as the distance from the folding axis FX decreases, the stress applied to the center of the support plate PLT may decrease when the electronic device ED (e.g., refer to FIG. 1) is folded. Accordingly, the stress applied to the center of the window module WM overlapping with the center of the support plate PLT may also decrease. Therefore, when the electronic device ED (e.g., refer to FIG. 1) is folded, a possibility of damage to the window module WM may be reduced.

In the present embodiment, a possibility of damage to the window module WM disposed on the support plate PLT is described in more detail as a representative example, however, the present disclosure is not limited thereto or thereby. The stress applied to the other layers disposed on an upper or lower portion of the support plate PLT may also decrease, and thus, a possibility of damage to the other layers may also be reduced.

Figure 12:
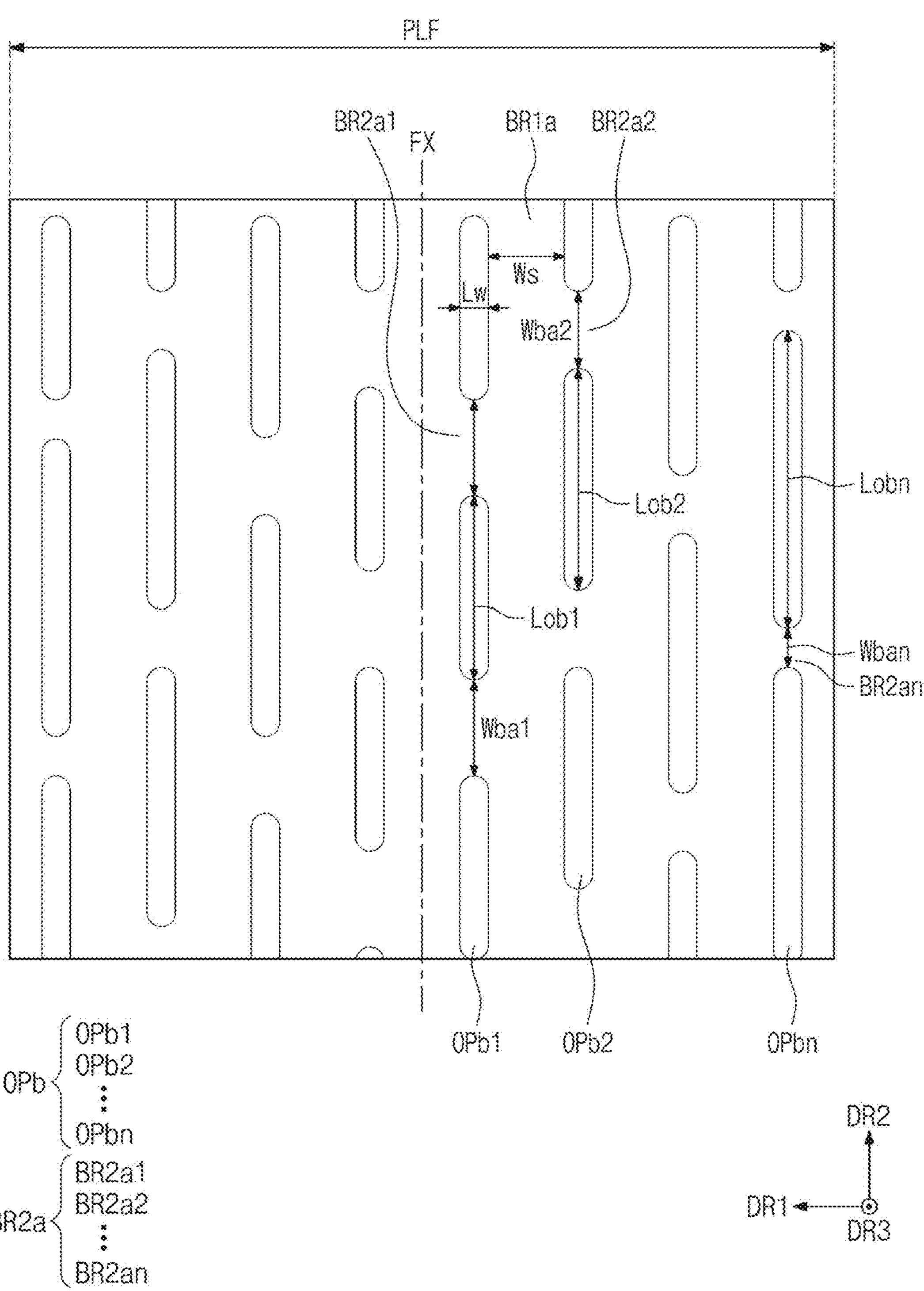
FIG. 12 is a plan view of a folding portion according to an embodiment of the present disclosure.

FIG. 12 is a plan view of a folding portion according to an embodiment of the present disclosure.

FIG. 12 is an enlarged plan view showing an example of the first area AA1 of FIG. 10A.

Referring to FIGS. 9A and 12, when viewed in the plane (e.g., in a plan view), a length Ws in the first direction DR1 of the first branches BR1 disposed between openings OPb adjacent to each other in the first direction DR1 may be uniform or substantially uniform. A length Lw in the first direction DR1 of the openings OPb may be uniform or substantially uniform.

When viewed in the plane (e.g., in a plan view), a length in the second direction DR2 of the openings OPb may be varied. The length in the second direction DR2 of the openings OPb may increase as a distance from the folding axis FX increases.

As an example, from among first, second, . . . , n-th columns sequentially arranged from the folding axis FX to the direction parallel to or substantially parallel to the first direction DR1, a length Lob1 in the second direction DR2 of the openings OPb1 arranged in the first column may be smaller than a length Lob2 in the second direction DR2 of the openings OPb2 arranged in the second column. The length Lob2 in the second direction DR2 of the openings OPb2 arranged in the second column may be smaller than a length Lobn in the second direction DR2 of the openings OPbn arranged in the n-th column. Here, n may be a natural number. The column may correspond to the second direction DR2.

In other words, from among the openings OPb, the length Lob1 in the second direction DR2 of the openings OPb1 closest to the folding axis FX may be the smallest length. From among the openings OPb, the length Lobn in the second direction DR2 of the openings OPbn adjacent to one side of the first and second non-folding portions PLT1 and PLT2 may be the largest length.

Accordingly, when viewed in the plane (e.g., in a plan view), an area of the openings OPb may increase as the distance from the folding axis FX increases. The area of the openings OPb adjacent to the folding axis FX may be the smallest at the center of the folding portion PLF, and the area of the openings OPb may gradually increase as a distance from the first and second non-folding portions PLT1 and PLT2 decreases.

A length in the second direction DR2 of the second branches BR2*a* disposed between the openings OPb that are adjacent to each other in the second direction DR2 may be varied. When viewed in the plane (e.g., in a plan view), the length in the second direction DR2 of the second branches BR2*a* may be decreased as the distance from the folding axis FX increases in a direction parallel to or substantially parallel to the first direction DR1.

In more detail, a length Wba1 of the second branches BR2*a*1 disposed between the openings OPb1 arranged in the first column may be greater than a length Wba2 of the second branches BR2*a*2 disposed between the openings OPb2 arranged in the second column. The length Wba2 of the second branches BR2*a*2 disposed between the openings OPb2 arranged in the second column may be greater than a length Wban of the second branches BR2*an* disposed between the openings OPbn arranged in the n-th column.

Accordingly, an area between the openings OPb that are adjacent to each other in the first direction DR1 and the second direction DR2 may be varied. As the distance from the folding axis FX increases, the area between the openings OPb that are adjacent to each other may decrease.

As the area of the openings OPb and the area between the openings OPb are varied, an area ratio of the openings OPb to the branches BR that are adjacent to the openings OPb may be varied. The area ratio of the openings OPb to the branches BR that are adjacent to the openings OPb may increase as the distance from the folding axis FX increases. Accordingly, the rigidity of the folding portion PLF may be varied. As the distance from the folding axis FX decreases, the rigidity of the folding portion PLF may increase.

As the rigidity of the folding portion PLF increases as the distance from the folding axis FX decreases, the stress applied to the center of the support plate PLT overlapping with the folding axis FX may decrease when the electronic device ED (e.g., refer to FIG. 1) is folded. Accordingly, the stress applied to the center of the window module WM overlapping with the center of the support plate PLT may also decrease. Therefore, when the electronic device ED (e.g., refer to FIG. 1) is folded, a possibility of damage to the window module WM may be reduced.

In the present embodiment, the possibility of damage to the window module WM disposed on the support plate PLT is described in more detail as a representative example, but the present disclosure is not limited thereto or thereby. The stress applied to the other layers disposed on an upper or lower portion of the support plate PLT may also be decreased, and thus, a possibility of damage to the other layers may also be reduced.

Figure 13:
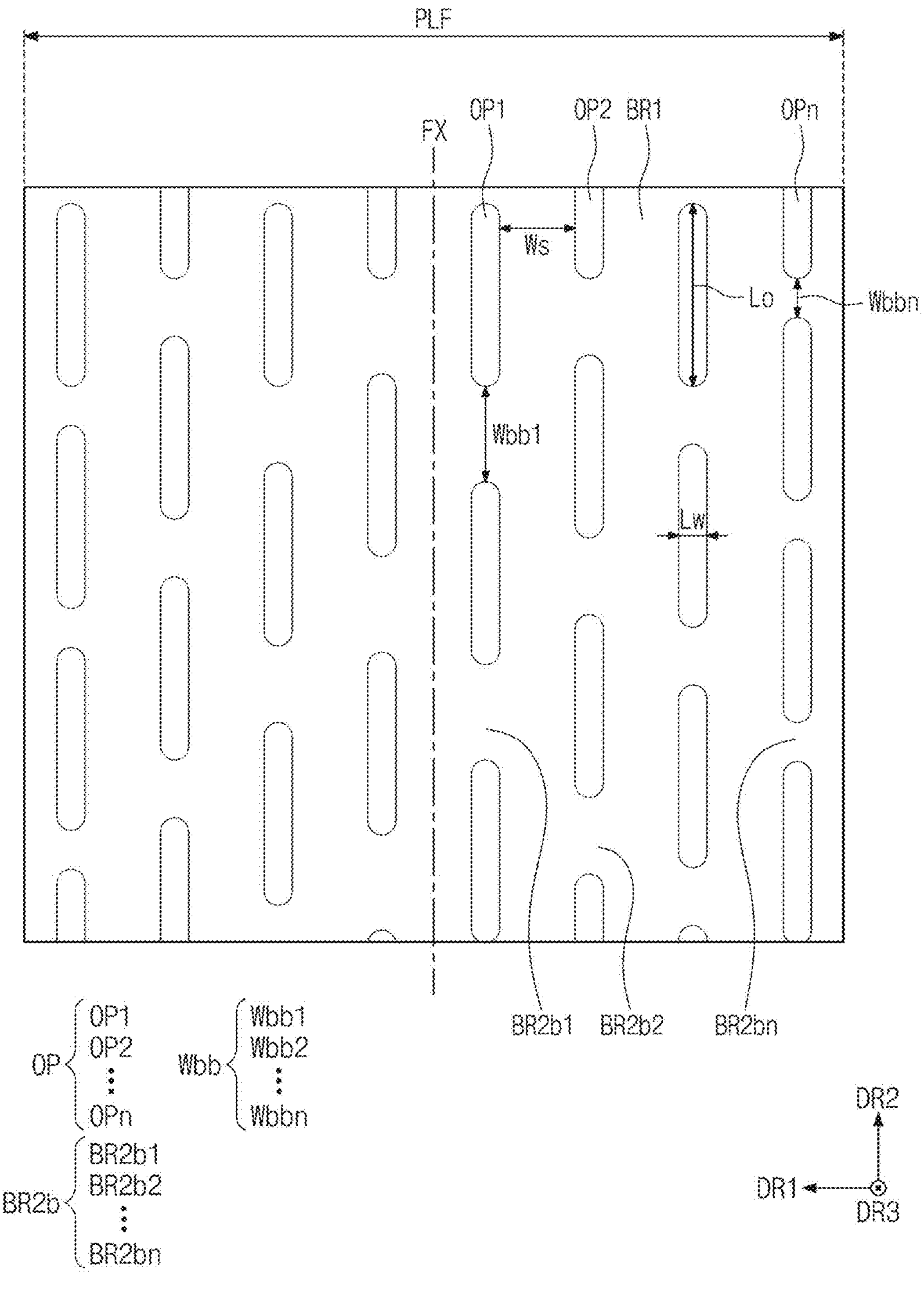
FIG. 13 is a plan view of a folding portion according to an embodiment of the present disclosure.

FIG. 13 is a plan view of a folding portion according to an embodiment of the present disclosure.

FIG. 13 is a plan view showing an example of the first area AA1 of FIG. 10A.

Because the first branches BR1 and openings OP of FIG. 13 are the same or substantially the same as the first branches BR1 described above with reference to FIG. 12 and the openings OP described above with reference to FIG. 10B, redundant description may not be repeated or may be simplified.

Referring to FIG. 13, a length Ws in the first direction DR1 of the first branches BR1 may be uniform or substantially uniform. A length Lw in the first direction DR1 of the openings OP may be uniform or substantially uniform. A length Lo in the second direction DR2 of the openings OP may be uniform or substantially uniform.

A length Wbb in the second direction DR2 of the second branches BR2*b* may be varied. The length Wbb in the second direction DR2 of the second branches BR2*b* may be decreased as a distance from the folding axis FX increases.

In more detail, from among first, second, . . . , n-th columns sequentially arranged from the folding axis FX to the direction parallel to or substantially parallel to the first direction DR1, a length Wbb1 of the second branches BR2*b*1 disposed between the openings OP1 of the first column may be smaller than a length Wbb2 of the second branches BR2*b*2 disposed between the openings OP2 of the second column. The length Wbb2 of the second branches BR2*b*2 disposed between the openings OP2 of the second column may be greater than a length Wbbn of the second branches BR2*bn* disposed between the openings OPn of the n-th column. The column may correspond to the second direction DR2.

As the length in the second direction DR2 of the second branches BR2*b* is varied, an area between the openings OP that are adjacent to each other in the first and second directions DR1 and DR2 may be varied. The area between the openings OP that are adjacent to each other may decrease as the distance from the folding axis FX increases. The area between the openings OP adjacent to the folding axis FX may be the largest area, and the area of the openings OP adjacent to the first and second non-folding portions PLT1 and PLT2 (e.g., refer to FIG. 10A) may be the smallest area.

An area ratio of the openings OP to the branches BR that are adjacent to the openings OP may be varied. The area ratio of the openings OP to the branches BR that are adjacent to the openings OP may increase as the distance from the folding axis FX increases. Accordingly, the rigidity of the folding portion PLF may be varied. As the distance from the folding axis FX decreases, the rigidity of the folding portion PLF may increase.

Because the rigidity of the folding portion PLF increases as the distance from the folding axis FX decreases, the stress applied to the center of the support plate PLT may decrease when the electronic device ED (e.g., refer to FIG. 1) is folded. Accordingly, the stress applied to the center of the window module WM overlapping with the center of the support plate PLT may also decrease. Therefore, when the electronic device ED (e.g., refer to FIG. 1) is folded, a possibility of damage to the window module WM may be reduced.

In the present embodiment, the possibility of damage to the window module WM disposed on the support plate PLT is described in more detail as a representative example, but the present disclosure is not limited thereto or thereby. The stress applied to the other layers disposed on an upper or lower portion of the support plate PLT may also decrease, and thus, a possibility of damage to the other layers may also be reduced.

Figure 14:
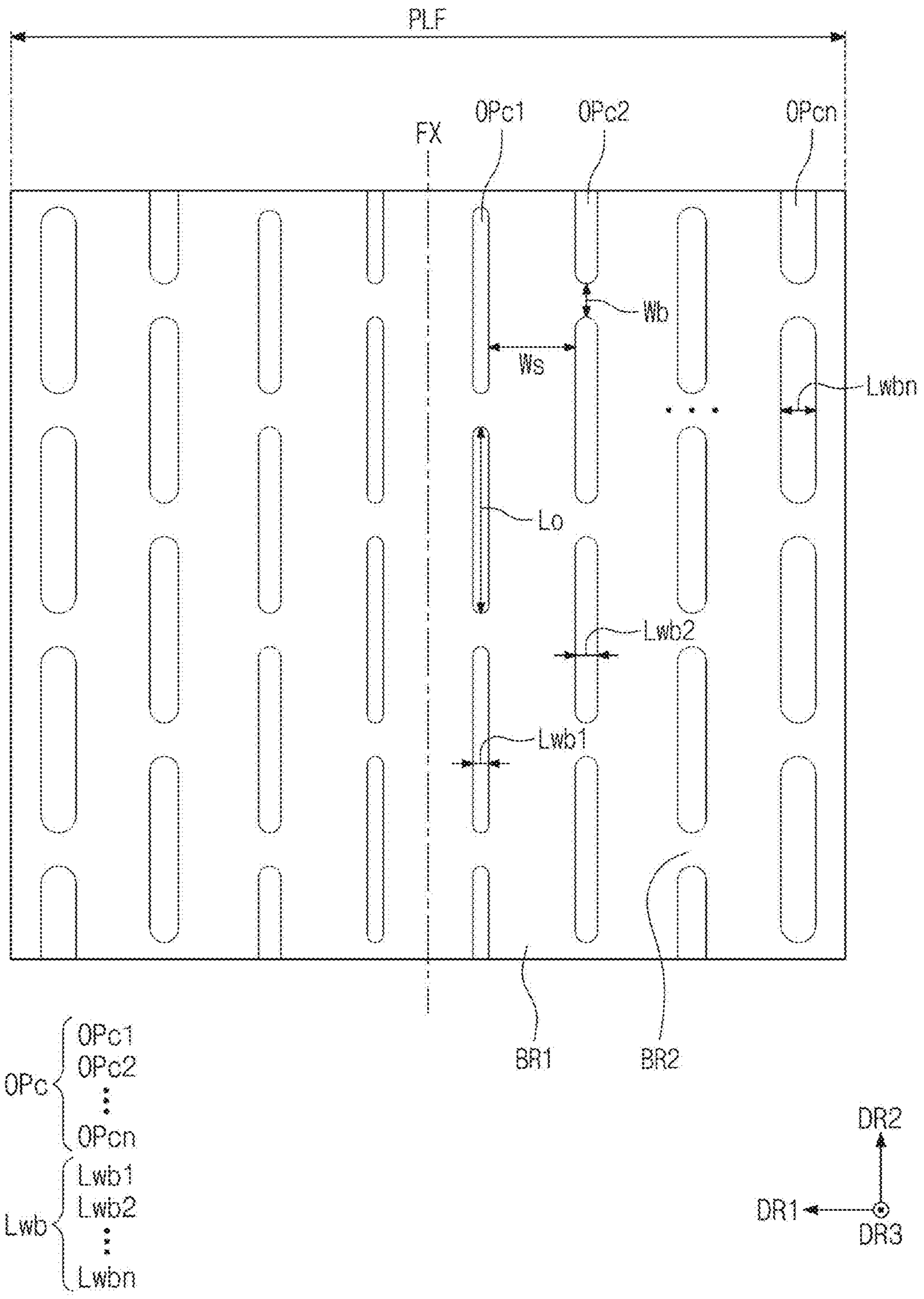
FIG. 14 is a plan view of a folding portion according to an embodiment of the present disclosure.

FIG. 14 is a plan view of a folding portion according to an embodiment of the present disclosure.

FIG. 14 is a plan view showing an example of the first area AA1 of FIG. 10A.

Because the first branches BR1 and the second branches BR2 of FIG. 14 are the same or substantially the same as the first branches BR1 described above with reference to FIG. 13 and the second branches BR2 described above with reference to FIG. 10B, redundant description may not be repeated or may be simplified.

Referring to FIG. 14, a length Ws in the first direction DR1 of the first branches BR1 may be uniform or substantially uniform. A length in the second direction DR2 of the second branches BR2 may be uniform or substantially uniform. A length Lo in the second direction DR2 of the openings OPc may be uniform or substantially uniform.

A length in the first direction DR1 of the openings OPc may be increased as a distance from the folding axis FX increases. As an example, from among first, second, . . . , n-th columns sequentially arranged from the folding axis FX to the direction parallel to or substantially parallel to the first direction DR1, a length Lwb1 in the first direction DR1 of the openings OPc1 arranged in the first column may be smaller than a length Lwb2 in the first direction DR1 of the openings OPc2 arranged in the second column. The length Lwb2 in the first direction DR1 of the openings OPc2 arranged in the second column may be smaller than a length Lwbn in the first direction DR1 of the openings OPcn arranged in the n-th column. Here, n may be a natural number. The column may correspond to the second direction DR2.

In other words, from among the openings OPc, the length Lwb1 in the first direction DR1 of the openings OPc1 closest to the folding axis FX may be the smallest length. The length Lwbn in the first direction DR1 of the openings OPcn farthest from the folding axis FX may be the largest length. In other words, from among the openings OPc, the length Lwbn in the first direction DR1 of the openings OPcn that are adjacent to one side of the first and second non-folding portions PLT1 and PLT2 may be the largest length. The one side of the first and second non-folding portions PLT1 and PLT2 may face the folding portion PLF.

Accordingly, when viewed in the plane (e.g., in a plan view), an area of the openings OPc may increase as the distance from the folding axis FX increases. The area of the openings OPc adjacent to the folding axis FX may be smallest at the center of the folding portion PLF, and the area of the openings OPc may gradually increase as a distance from the first and second non-folding portions PLT1 and PLT2 decreases. As the area of the openings OPc decreases in the folding portion PLF adjacent to the folding axis FX, an area ratio of the openings OPc to the branches BR that are adjacent to the openings OPc may be varied. The area ratio of the openings OPc to the branches BR that are adjacent to the openings OPc may increase as the distance from the folding axis FX increases. Accordingly, the rigidity of the folding portion PLF may be varied. As the distance from the folding axis FX decreases, the rigidity of the folding portion PLF may increase.

Because the rigidity of the folding portion PLF increases as the distance from the folding axis FX decreases, the stress applied to the center of the support plate PLT may decrease when the electronic device ED (e.g., refer to FIG. 1) is folded. Accordingly, the stress applied to the center of the window module WM overlapping with the center of the support plate PLT may also decrease. Therefore, when the electronic device ED (e.g., refer to FIG. 1) is folded, a possibility of damage to the window module WM may be reduced.

In the present embodiment, the possibility of damage to the window module WM disposed on the support plate PLT is described in more detail as a representative example, but the present disclosure is not limited thereto or thereby. The stress applied to the other layers disposed on an upper or lower portion of the support plate PLT may also decrease, and thus, a possibility of damage to the other layers may also be reduced.

Figure 15A:
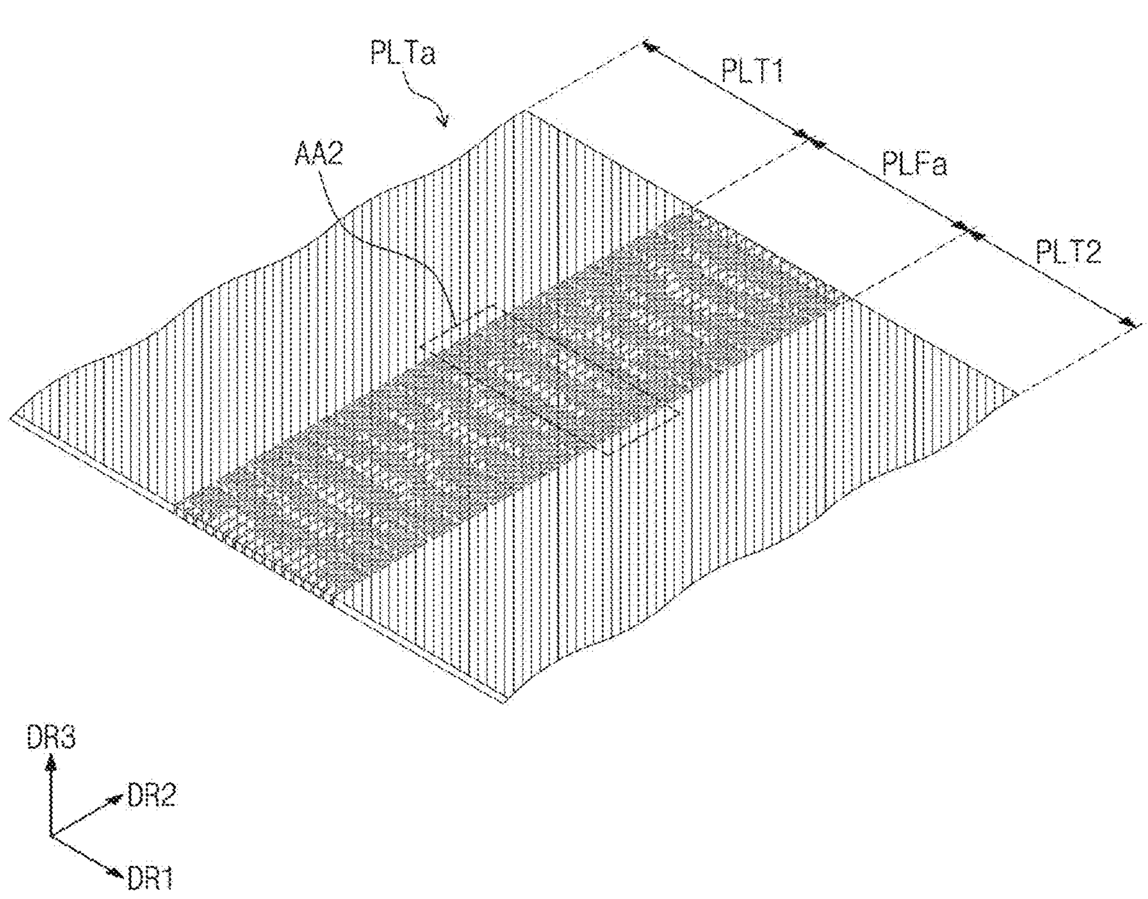
Figure 15B:
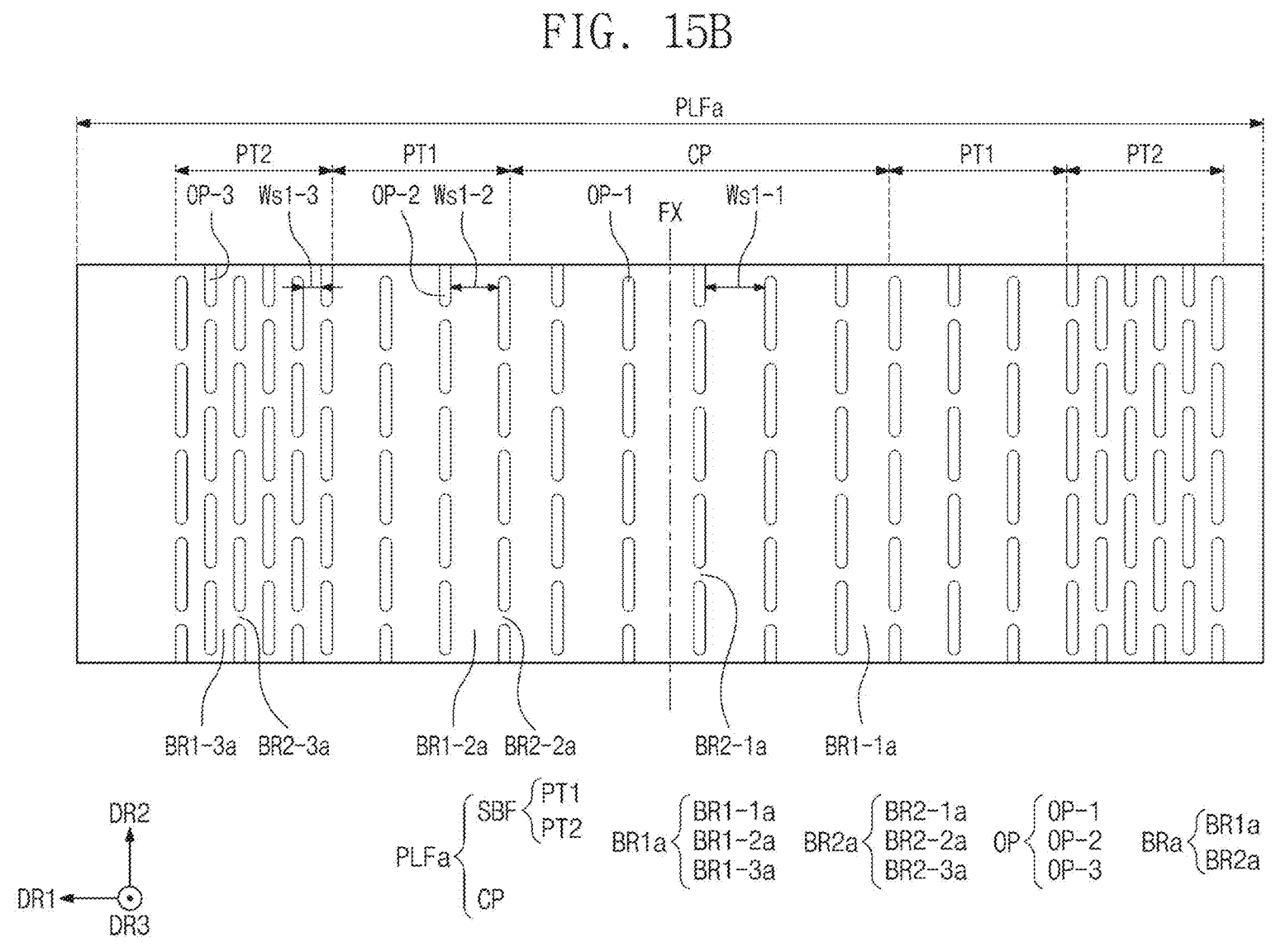

FIGS. 15A and 15B are views of a support plate PLTa according to an embodiment of the present disclosure.

FIG. 15A is a perspective view, and FIG. 15B is an enlarged plan view of the second area AA2 shown in FIG. 15A.

Because the first non-folding portion PLT1, the second non-folding portion PLT2, and the folding axis FX of FIG. 15A are the same or substantially the same as the first non-folding portion PLT1 and the second non-folding portion PLT2 described above with reference to FIG. 10A and the folding axis FX described above with reference to FIG. 10B, redundant description may not be repeated or may be simplified.

Referring to FIG. 15A, the folding portion PLFa may be disposed between the first and second non-folding portions PLT1 and PLT2. The first non-folding portion PLT1, the folding portion PLFa, and the second non-folding portion PLT2 may be arranged along the first direction DR1.

Referring to FIGS. 15A and 15B, the folding portion PLFa may include a center portion CP, and a plurality of sub-folding portions SBF arranged symmetrically or substantially symmetrically in the first direction DR1 with respect to the center portion CP.

The sub-folding portions SBF may include a plurality of first portions PT1 and a plurality of second portions PT2. When viewed in the plane (e.g., in a plan view), the first portions PT1 may be symmetrically arranged in the first direction DR1 with respect to the center portion CP. The first portions PT1 may be disposed at both opposite sides of the center portion CP, respectively, in the first direction DR1.

When viewed in the plane (e.g., in a plan view), the second portions PT2 may be symmetrically arranged in the first direction DR1 with respect to the center portion CP. The second portions PT2 may be disposed at both opposite sides, respectively, of the first portions PT1 in the first direction DR1, which are adjacent to the second portions PT2. One side of both opposite sides of each of the first portions PT1 in the first direction DR1 may be opposite to the other side of the both opposite sides of each of the first portions PT1, which is adjacent to the center portion CP.

As an example, FIG. 15B shows a structure in which two first portions PT1 and two second portions PT2 are arranged in the folding portion PLFa, but the number of the first portions PT1 and the number of the second portions PT2 are not limited thereto or thereby. According to an embodiment, the folding portion PLFa may include one or three or more first portions PT1, and one or three or more second portions PT2.

Hereinafter, for convenience, the first portion PT1 and the second portion PT2, which are disposed at the left side of the center portion CP when viewed in the plane (e.g., in a plan view), will be described in more detail, and the first and second portions PT1 and PT2 disposed at the right side of the center portion CP may have the same or substantially the same structure as those of the first and second portions PT1 and PT2 disposed at the left side of the center portion CP.

A plurality of openings OP may be defined through (e.g., penetrate) each of the center portion CP and the sub-folding portions SBF. The openings OP may be arranged along the first direction DR1 and the second direction DR2. The openings OP may include first openings OP-1, second openings OP-2, and third openings OP-3.

The first openings OP-1 may be defined through (e.g., penetrate) the center portion CP. The first openings OP-1 may be arranged along the first direction DR1 and the second direction DR2. The first openings OP-1 that are adjacent to each other in the first direction DR1 may be arranged staggered with each other.

The center portion CP may include first-first branches BR1-1*a* and second-first branches BR2-1*a*. The first-first branches BR1-1*a* may be disposed between the first openings OP-1 that are adjacent to each other in the first direction DR1. The second-first branches BR2-1*a* may be disposed between the first openings OP-1 that are adjacent to each other in the second direction DR2. The first-first branches BR1-1*a* may extend in the second direction DR2, and the second-first branches BR2-1*a* may extend in the first direction DR1. The first openings OP-1 may be defined by the first-first branches BR1-1*a* and the second-first branches BR2-1*a*.

The folding axis FX may overlap with the center portion CP. The folding axis FX may overlap with the first-first branches BR1-1*a*. The folding portion PLFa may be folded with respect to the folding axis FX.

The second openings OP-2 may be defined through (e.g., penetrate) the first portion PT1. The second openings OP-2 may be arranged along the first direction DR1 and the second direction DR2. The second openings OP-2 that are adjacent to each other in the first direction DR1 may be arranged staggered with each other.

The first portion PT1 may include first-second branches BR1-2*a* and second-second branches BR2-2*a*. The first-second branches BR1-2*a* may be disposed between the second openings OP-2 that are adjacent to each other in the first direction DR1. The second-second branches BR2-2*a* may be disposed between the second openings OP-2 that are adjacent to each other in the second direction DR2. The first-second branches BR1-2*a* may extend in the second direction DR2, and the second-second branches BR2-2*a* may extend in the first direction DR1. The second openings OP-2 may be defined by the first-second branches BR1-1*a* and the second-second branches BR2-2*a*.

The third openings OP-3 may be defined through (e.g., penetrate) the second portion PT2. The third openings OP-3 may be arranged along the first direction DR1 and the second direction DR2. The third openings OP-3 that are adjacent to each other in the first direction DR1 may be arranged staggered with each other.

The second portion PT2 may include first-third branches BR1-3*a* and second-third branches BR2-3*a*. The first-third branches BR1-3*a* may be disposed between the third openings OP-3 that are adjacent to each other in the first direction DR1. The second-third branches BR2-3*a* may be disposed between the third openings OP-3 that are adjacent to each other in the second direction DR2. The first-third branches BR1-3*a* may extend in the second direction DR2, and the second-third branches BR2-3*a* may extend in the first direction DR1. The third openings OP-3 may be defined by the first-third branches BR1-3*a* and the second-third branches BR2-3*a*.

When viewed in the plane (e.g., in a plan view), the first-first branches BR1-1*a* disposed between the first openings OP-1 that are adjacent to each other in the first direction DR1 may have a first-first length Ws1-1 in the first direction DR1. When viewed in the plane (e.g., in a plan view), the first-second branches BR1-2*a* disposed between the second openings OP-2 that are adjacent to each other in the first direction DR1 may have a first-second length Ws1-2 in the first direction DR1. When viewed in the plane (e.g., in a plan view), the first-third branches BR1-3*a* disposed between the third openings OP-3 that are adjacent to each other in the first direction DR1 may have a first-third length Ws1-3 in the first direction DR1.

When viewed in the plane (e.g., in a plan view), the first branches BR1*a* may have a length that is variable in the first direction DR1. The length of the first branches BR1*a* in the first direction DR1 may be decreased as a distance from the folding axis FX increases. In more detail, the first-first length Ws1-1 in the first direction DR1 of the first-first branches BR1-1*a* disposed at the center portion CP may be greater than the first-second length Ws1-2 in the first direction DR1 of the first-second branches BR1-2*a* disposed at the first portion PT1. The first-second length Ws1-2 in the first direction DR1 of the first-second branches BR1-2*a* disposed at the first portion PT1 may be greater than the first-third length Ws1-3 in the first direction DR1 of the first-third branches BR1-3*a* disposed at the second portion PT2. In other words, the first-first length Ws1-1 of the first-first branches BR1-1 may be the largest length, and the first-third length Ws1-3 of the first-third branches BR1-3 may be the smallest length.

As the lengths in the first direction DR1 of the first-first branches BR1-1*a*, the first-second branches BR1-2*a*, and the first-third branches BR1-3*a* are varied as the distance from the folding axis FX increases, an area between the openings OP that are adjacent to each other may be varied. An area between the first openings OP-1 that are adjacent to each other in the first and second directions DR1 and DR2 may be greater than an area between the second openings OP-2 that are adjacent to each other in the first and second directions DR1 and DR2. The area between the second openings OP-2 that are adjacent to each other in the first and second directions DR1 and DR2 may be greater than an area between the third openings OP-3 that are adjacent to each other in the first and second directions DR1 and DR2.

As the areas of the first-first branches BR1-1*a* to the first-third branches BR1-3*a* are varied, an area ratio of the openings OP to the branches BRa respectively adjacent to the openings OP may be varied. An area ratio of the openings OP to the branches BRa respectively adjacent to the openings OP may increase as the distance from the folding axis FX increases. In other words, the area ratio of the openings OP to the branches BRa in the center portion CP may be the smallest, and the area ratio of the openings OP to the branches BRa in the second portion PT2 may be the largest.

As the area ratio of the openings OP to the branches BRa is varied, a rigidity of the center portion CP and a rigidity of the sub-folding portions SBF may be varied. The rigidity may be inversely proportional to the area ratio of the openings OP to the branches BRa. As the distance from the folding axis FX increases, the rigidity of the folding portion PLFa may decrease. In other words, the rigidity of the center portion CP may be the largest, and the rigidity of the second portion PT2 may be the smallest.

Accordingly, when the folding portion PLFa is folded, the amount in variation of the center portion CP against to the external force may decrease, and the stress applied to the center portion CP may decrease. As the stress applied to the center portion CP decreases, the stress applied to the portion of the window module WM (e.g., refer to FIG. 9A), which is disposed on the support plate PLTa and overlaps with the center portion CP, may decrease. Accordingly, when the electronic device ED (e.g., refer to FIG. 1) is folded, the window module WM (e.g., refer to FIG. 9A) may be prevented or substantially prevented from being damaged.

In the present embodiment, a possibility of damage to the window module WM disposed on the support plate PLTa is described in more detail as a representative example, but the present disclosure is not limited thereto or thereby. The stress applied to the other layers disposed on an upper or lower portion of the support plate PLTa may also decrease, and a possibility of damage to the other layers may also be reduced.

When viewed in the plane (e.g., in a plan view), lengths in the second direction DR2 of the second branches BR2*a* disposed in the center portion CP, the first portion PT1, and the second portion PT2 may be the same or substantially the same as each other. When viewed in the plane (e.g., in a plan view), lengths in the first direction DR1 of the openings OP may be the same or substantially the same as each other, and lengths in the second direction DR2 of the openings OP may be the same or substantially the same as each other. However, at least one of the length in the second direction DR2 of the second branches BR2*a*, the length in the first direction DR1 of the openings OP, and/or the length in the second direction DR2 of the openings OP may be varied. This will be described in more detail below with reference to FIGS. 16 and 17.

Figure 16:
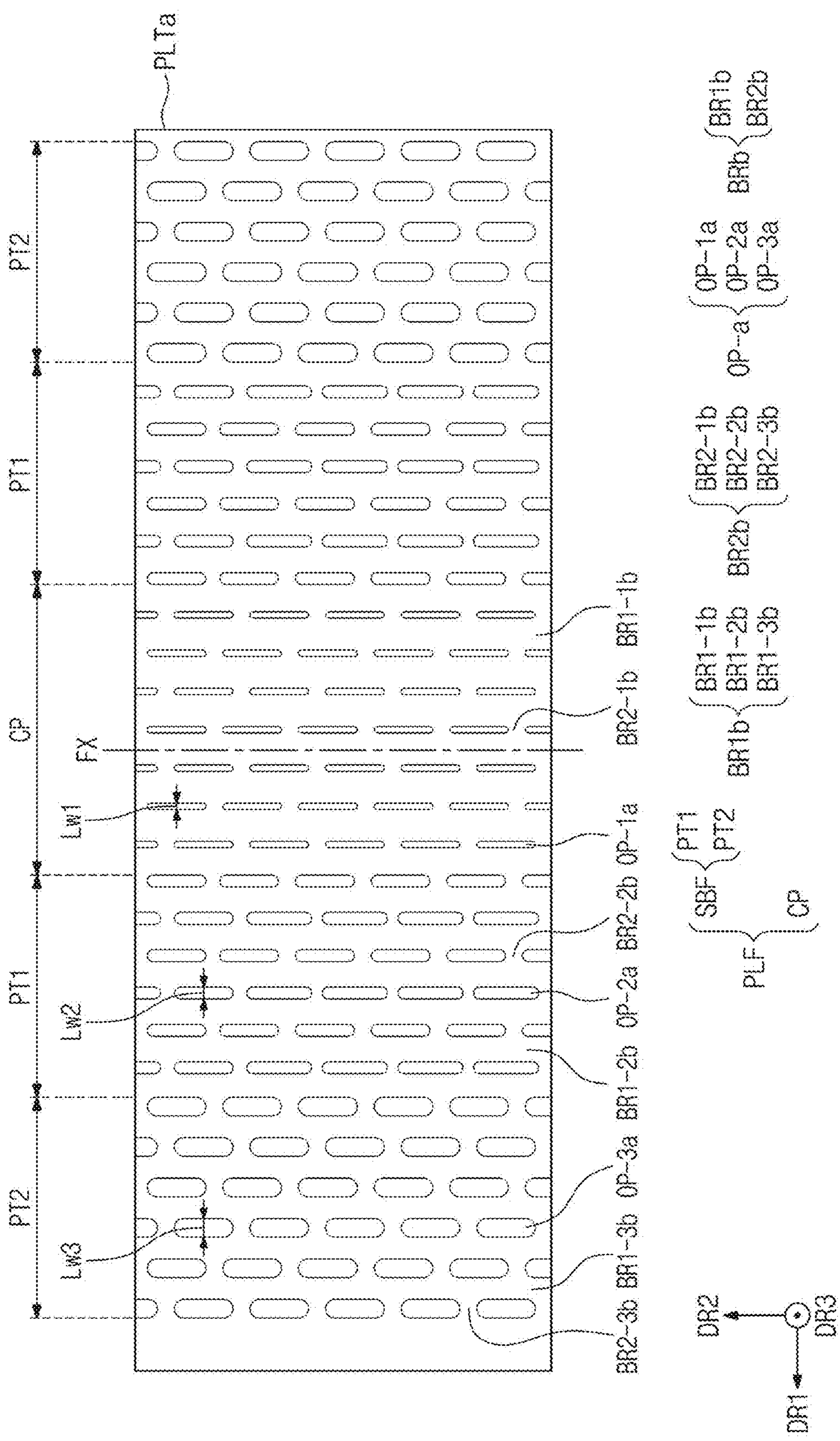
FIG. 16 is a plan view of a folding portion according to an embodiment of the present disclosure.

FIG. 16 is a plan view of a folding portion according to an embodiment of the present disclosure.

FIG. 16 is an enlarged plan view of the second area AA2 shown in FIG. 15A.

Because the center portion CP, the folding axis FX, the first portion PT1, and the second portion PT2 of FIG. 16 are the same or substantially the same as the center portion CP, the folding axis FX, the first portion PT1, and the second portion PT2 described above with reference to FIG. 15B, redundant description may not be repeated or may be simplified.

For convenience, the first portion PT1 and the second portion PT2, which are disposed at the left side of the center portion CP in FIG. 16, will be described in more detail as a representative example, and the first portion PT1 and the second portion PT2, which are disposed at the right side of the center portion CP, may have the same or substantially the same structure as those of the first portion PT1 and the second portion PT2 that are disposed at the left side of the center portion CP.

As such, the differences between the folding portion illustrated in FIG. 16 and the folding portion illustrated in FIG. 15B will be described in more detail hereinafter.

Referring to FIG. 16, when viewed in the plane (e.g., in a plan view), a length in the first direction DR1 of openings OP-a may be varied. When viewed in the plane (e.g., in a plan view), first, second, and third openings OP-1*a*, OP-2*a*, and OP-3*a* may have different lengths in the first direction DR1 from each other. The length in the first direction DR1 of each of the openings OP-a may be increased as a distance from the folding axis FX increases.

In more detail, when viewed in the plane (e.g., in a plan view), a length Lw1 in the first direction DR1 of the first openings OP-1*a* may be smaller than a length Lw2 in the first direction DR1 of the second openings OP-2*a*. The length Lw2 in the first direction DR1 of the second openings OP-2*a* may be smaller than a length in the first direction DR1 of the third openings OP-3*a*. In other words, from among the openings OP-a, the length Lw1 in the first direction DR1 of the first openings OP-1*a* may be the smallest, and the length Lw3 in the first direction DR1 of the third openings OP-3*a* may be the largest.

When viewed in the plane (e.g., in a plan view), as the length in the first direction DR1 of the openings OP-a is varied, an area of the openings OP-a may be varied. As the distance from the folding axis FX increases, the area of the openings OP-a may increase. In other words, the area of the first openings OP-1*a* defined through the center portion CP may be the smallest, and the area of the third openings OP-3*a* defined through the second portion PT2 may be largest.

Accordingly, an area ratio of the openings OP-a to the branches BRb respectively adjacent to the openings OP-a may be varied. The area ratio of the openings OP-a to the branches BRb respectively adjacent to the openings OP-a may increase as the distance from the folding axis FX increases.

As the area ratio of the openings OP-a to the branches BRb is varied, a rigidity of the center portion CP and the sub-folding portions SBF may be varied. The rigidity may be inversely proportional to the area ratio of the openings OP-a to the branches BRb. As the distance from the folding axis FX increases, the rigidity of the folding portion PLF may decrease. In other words, the center portion CP may have the largest rigidity, and the second portion PT2 may have the smallest rigidity.

Accordingly, when the folding portion PLF is folded, the amount in variation of the center portion CP against to the external force may decrease, and the stress applied to the center portion CP may decrease. As the stress applied to the center portion CP decreases, the stress applied to the portion of the window module WM (e.g., refer to FIG. 9A), which is disposed on the support plate PLT and overlaps with the center portion CP, may decrease. Accordingly, when the electronic device ED (e.g., refer to FIG. 1) is folded, the window module WM (e.g., refer to FIG. 9A) may be prevented or substantially prevented from being damaged.

In the present embodiment, a possibility of damage to the window module WM disposed on the support plate PLT is described in more detail as a representative example, but the present disclosure is not limited thereto or thereby. The stress applied to the other layers disposed on an upper or lower portion of the support plate PLT may also decrease, and the other layers may also be prevented or substantially prevented from being damaged.

Figure 17:
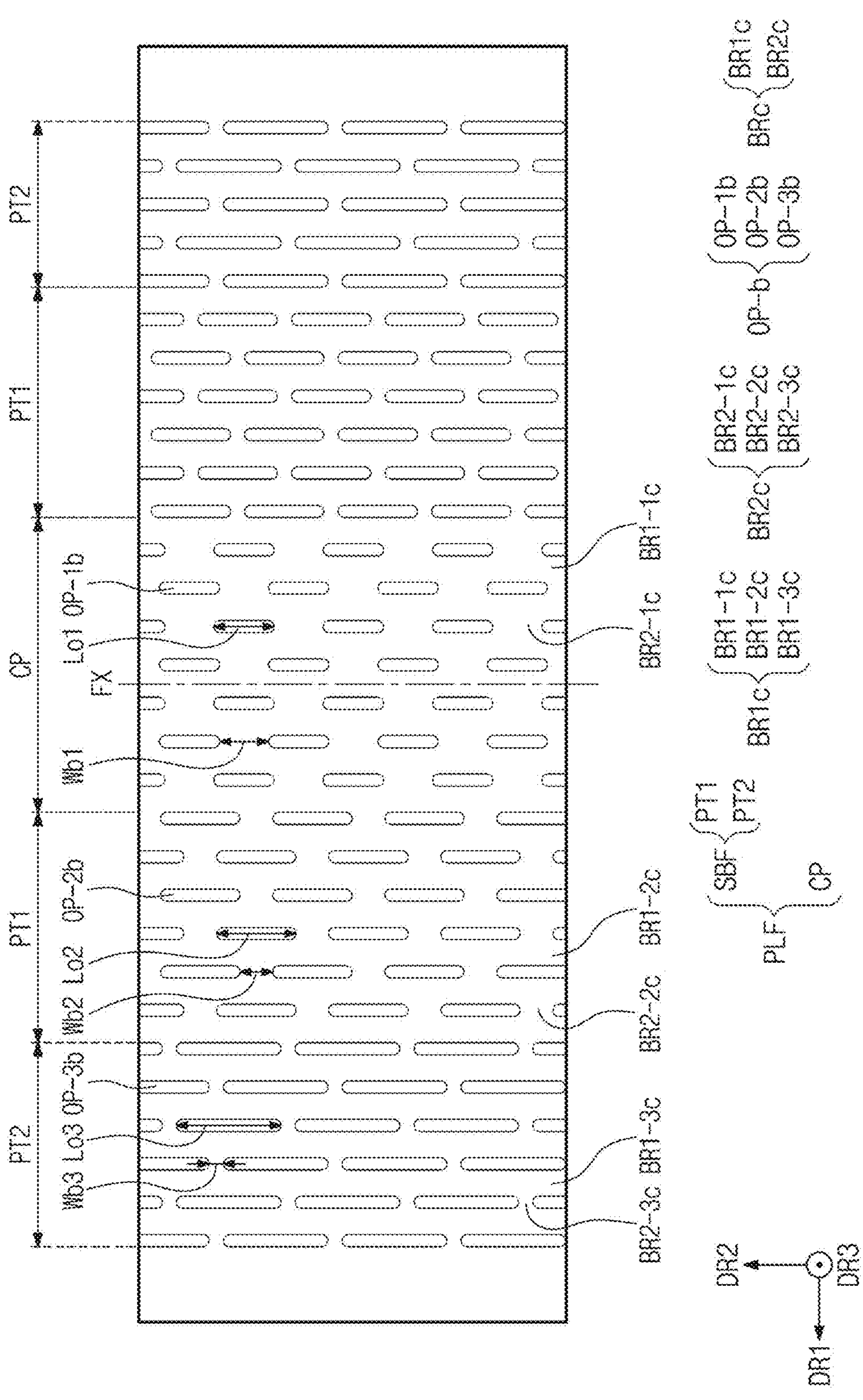
FIG. 17 is a plan view of a folding portion according to an embodiment of the present disclosure.

FIG. 17 is a plan view of a folding portion according to an embodiment of the present disclosure.

FIG. 17 is an enlarged plan view of the second area AA2 shown in FIG. 15A.

Because the center portion CP, the folding axis FX, the first portion PT1, and the second portion PT2 of FIG. 17 are the same or substantially the same as the center portion CP, the folding axis FX, the first portion PT1, and the second portion PT2 described above with reference to FIG. 15B, redundant description may not be repeated or may be simplified.

For convenience, the first portion PT1 and the second portion PT2, which are disposed at the left side of the center portion CP in FIG. 17, will be described in more detail as a representative example, but the first portion PT1 and the second portion PT2, which are disposed at the right side of the center portion CP, may have the same or substantially the same structure as those of the first portion PT1 and the second portion PT2 disposed at the left side of the center portion CP.

As such, the differences between the folding portion illustrated in FIG. 17 and the folding portion illustrated in FIG. 15B may be described in more detail hereinafter.

Referring to FIG. 17, when viewed in the plane (e.g., in a plan view), a length in the second direction DR2 of the openings OP-b may be varied. When viewed in the plane (e.g., in a plan view), first, second, and third openings OP-1*b*, OP-2*b*, and OP-3*b* may have different lengths in the second direction DR2 from each other. The length in the second direction DR2 of each of the openings OP-b may be increased as a distance from the folding axis FX increases.

In more detail, when viewed in the plane (e.g., in a plan view), a length Lo1 in the second direction DR2 of the first openings OP-1*b* may be smaller than a length Lo2 in the second direction DR2 of the second openings OP-2*b*. The length Lo2 in the second direction DR2 of the second openings OP-2*b* may be smaller than a length Lo3 in the second direction DR2 of the third openings OP-3*b*. In other words, from among the openings OP-b, the length Lo1 in the second direction DR2 of the first openings OP-1*b* may be the smallest, and the length Lo3 in the second direction DR2 of the third openings OP-3*b* may be the largest.

When viewed in the plane (e.g., in a plan view), as the length in the second direction DR2 of the openings OP-b is varied, an area of the openings OP-b may be varied. As the distance from the folding axis FX increases, the area of the openings OP-b may increase. In other words, the area of the first openings OP-1*b* defined through the center portion CP may be the smallest, and the area of the third openings OP-3*b* defined through the second portion PT2 may be the largest.

When viewed in the plane (e.g., in a plan view), a length in the second direction DR2 of the second branches BR2*c* may be varied. When viewed in the plane (e.g., in a plan view), second-first branches BR2-1*c*, second-second branches BR2-2*c*, and second-third branches BR2-3*c* may have different lengths from each other in the second direction DR2. The length in the second direction DR2 of each of the second branches BR2*c* may be decreased as the distance from the folding axis FX increases.

In more detail, when viewed in the plane (e.g., in a plan view), a length Wb1 in the second direction DR2 of the second-first branches BR2-1*c* may be greater than a length Wb2 in the second direction DR2 of the second-second branches BR2-2*c*. The length Wb2 in the second direction DR2 of the second-second branches BR2-2*c* may be greater than a length Wb3 in the second direction DR2 of the second-third branches BR2-3*c*. In other words, from among the second branches BR2*c*, the length in the second direction DR2 of the second-first branches BR2-1c may be the largest, and the length in the second direction DR2 of the second-third branches BR2-3c may be the smallest.

As the length in the second direction DR2 of the second branches BR2c is varied, an area between the openings OP-b that are adjacent to each other may be varied. As the distance from the folding axis FX increases, the area between the openings OP-b that are adjacent to each other may decrease.

As the area of the openings OP-b and the area between the openings OP-b that are adjacent to each other are varied, an area ratio of the openings OP-b to the branches BRc respectively adjacent to the openings OP-b may be varied. The area ratio of the openings OP-b to the branches BRc respectively adjacent to the openings OP-b may increase as the distance from the folding axis FX increases.

As the area ratio of the openings OP-b to the branches BRc respectively adjacent to the openings OP-b is varied, a rigidity of the center portion CP and the sub-folding portions SBF may be varied. The rigidity may be inversely proportional to the area ratio of the openings OP-b to the branches BRc. As the distance from the folding axis FX increases, the rigidity of the folding portion PLF may decrease. In other words, the rigidity of the center portion CP may be the largest, and the rigidity of the second portion PT2 may be the smallest.

Accordingly, when the folding portion PLF is folded, the amount in variation of the center portion CP against the external force may decrease, and the stress applied to the center portion CP may decrease. As the stress applied to the center portion CP decreases, the stress applied to the portion of the window module WM (e.g., refer to FIG. 9A), which is disposed on the support plate PLT and overlaps with the center portion CP, may decrease. Accordingly, when the electronic device ED (e.g., refer to FIG. 1) is folded, the window module WM (e.g., refer to FIG. 9A) may be prevented or substantially prevented from being damaged.

In the present embodiment, a possibility of damage to the window module WM disposed on the support plate PLT is described in more detail as a representative example, but the present disclosure is not limited thereto or thereby. The stress applied to the other layers disposed on an upper or lower portion of the support plate PLT may be decreased, and a possibility of damage to the other layers may be reduced.

Figure 18:
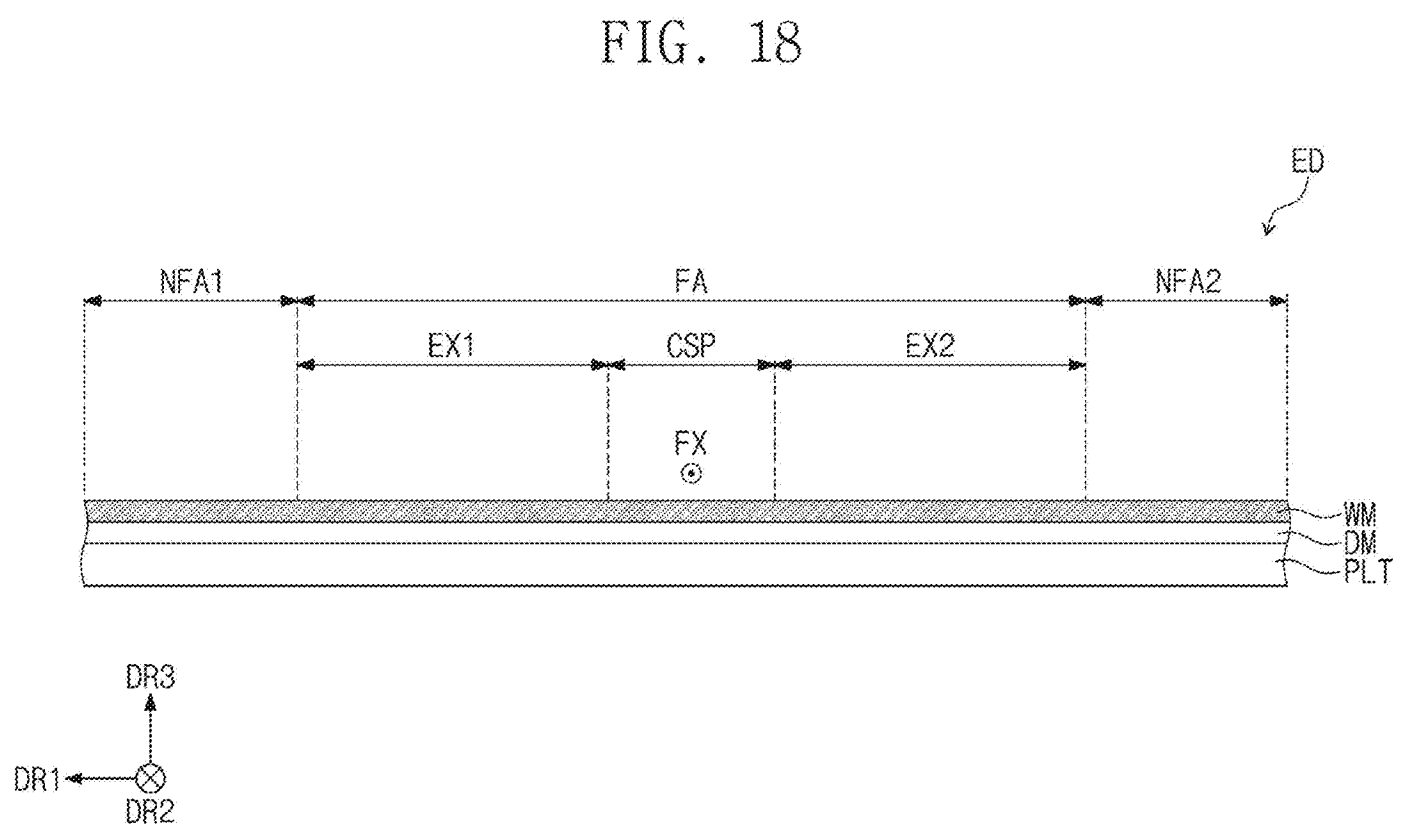

FIG. 18 is a cross-sectional view of the window module, the display module, and the support plate shown in FIG. 9A.

Figure 19:
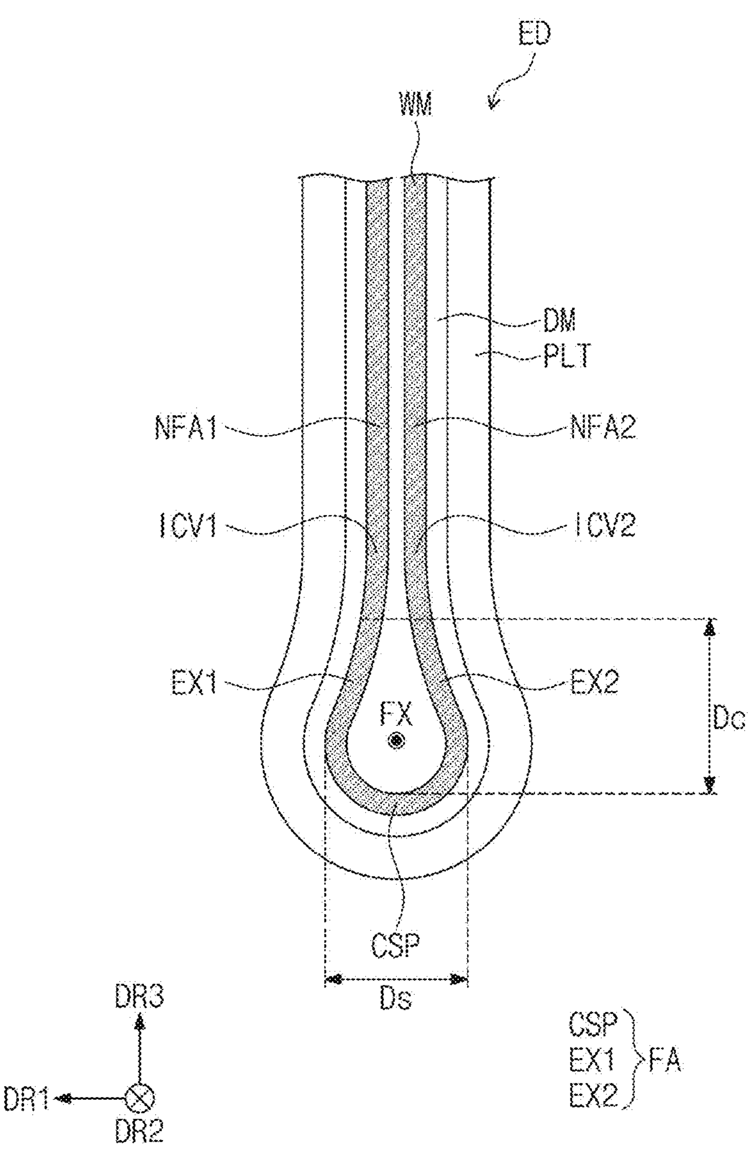
FIG. 19 is a view illustrating a folded state of a window module, a display module, and a support plate according to an embodiment of the present disclosure.

FIG. 19 is a view illustrating a folded state of the window module, the display module, and the support plate according to an embodiment of the present disclosure.

Figure 20:
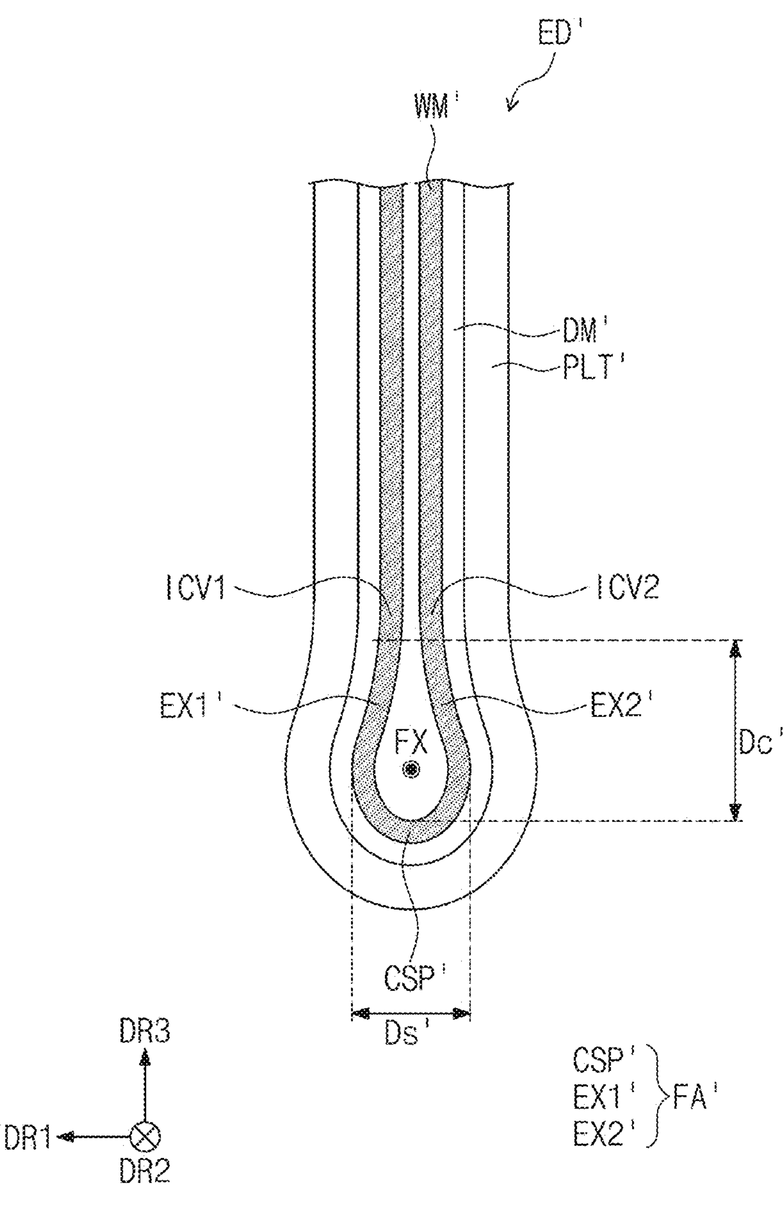
FIG. 20 is a cross-sectional view of a window module, a display module, and a support plate according to a comparative example.

FIG. 20 is a cross-sectional view of a window module, a display module, and a support plate according to a comparative example.

Figure 21:
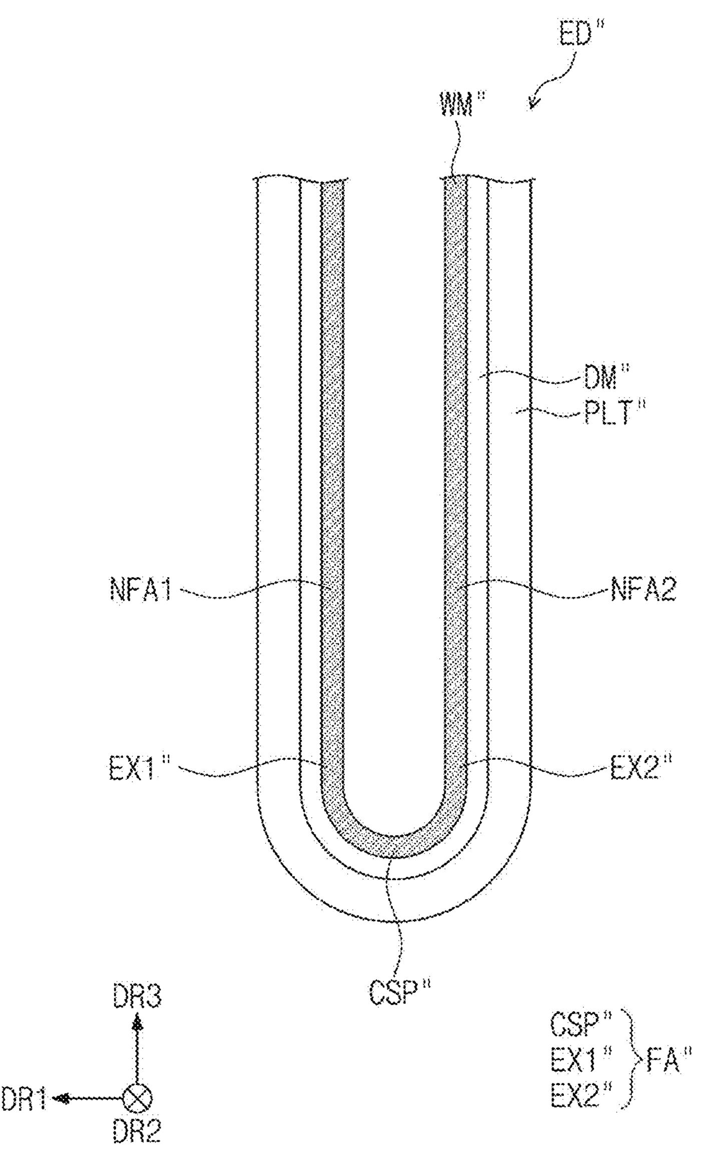
FIG. 21 is a view illustrating a folded state of the window module, the display module, and the support plate shown in FIG. 18, according to an embodiment of the present disclosure.

FIG. 21 is a view illustrating a folded state of the window module, the display module, and the support plate shown in FIG. 18, according to an embodiment of the present disclosure.

As an example, FIGS. 18 to 21 are cross-sectional views of a portion of the electronic device ED (e.g., refer to FIG. 1) when viewed in the second direction DR2.

For convenience of illustration, each of the window module WM and the display module DM are schematically shown as a single layer in FIGS. 18 to 21.

For convenience of illustration, the openings OP (e.g., refer to FIG. 9A) that are defined through (e.g., penetrate) the support plate PLT are omitted in FIGS. 18 to 21.

For convenience of illustration, the layers that are disposed between the display module DM and the support plate PLT are omitted in FIGS. 18 to 21.

Referring to FIG. 18, the folding area FA may include a curved surface portion CSP and extension portions EX1 and EX2. The extension portions EX1 and EX2 may be disposed between the curved surface portion CSP and the first non-folding area NFA1 and between the curved surface portion CSP and the second non-folding area NFA2, respectively. The folding axis FX may overlap with the curved surface portion CSP.

Referring to FIGS. 18 and 19, when the folding area FA is folded with respect to the folding axis FX, the support plate PLT, the display module DM, and the window module WM may be folded. The folding area FA may be bent, and thus, the support plate PLT, the display module DM, and the window module WM may be folded. The first non-folding area NFA1 and the second non-folding area NFA2 may rotate with respect to the folding axis FX to face each other. The folding area FA may be bent into a curved line shape while being folded. When the folding area FA is bent into the curved line shape, a portion of the display module DM and a portion of the window module WM may be bent into the curved line shape.

When the folding area FA is bent into the curved line shape, a portion overlapping with the folding axis FX may have a suitable curvature (e.g., a predetermined curvature). The curved surface portion CSP may be bent to have a suitable curvature (e.g., a predetermined curvature) when the electronic device ED is folded. In other words, the curved surface portion CSP may be bent to have a suitable radius of curvature (e.g., a predetermined radius of curvature). The portion of the display module DM and the portion of the window module WM, which are disposed on the curved surface portion CSP, may have a suitable curvature (e.g., a predetermined curvature).

The portions of the display module DM and the window module WM between the first extension portion EX1 and the first non-folding area NFA1 may be bent. The first extension portion EX1 may be bent from the first non-folding area NFA1, and may extend to the curved surface portion CSP.

The portions of the display module DM and the window module WM between the second extension portion EX2 and the second non-folding area NFA2 may be bent. The second extension portion EX2 may be bent from the second non-folding area NFA2, and may extend to the curved surface portion CSP.

The bent portion of the window module WM between the first extension portion EX1 and the first non-folding area NFA1 may be defined as a first inverse curvature portion ICV1. The bent portion of the window module WM between the second extension portion EX2 and the second non-folding area NFA2 may be defined as a second inverse curvature portion ICV2. When the window module WM is folded, the first inverse curvature portion ICV1 and the second inverse curvature portion ICV2 may be bent in a direction opposite to that of the curved surface portion CSP.

Referring to FIG. 20, a curvature of a curved surface portion CSP' may increase as a distance from a center of the curved surface portion CSP' decreases. A radius may decrease as the distance from the center of the curved surface portion CSP' decreases. Accordingly, a degree of curvature of the curved surface portion CSP' may be the largest at the center of the curved surface portion CSP'. Therefore, stress may occur on an upper surface of the curved surface portion CSP'.

Accordingly, a degree of curvature of a window module WM' and a display module DM' may be the largest in a portion of the window module WM' and a portion of the display module DM' that overlap with the center of the curved surface portion CSP'. Thus, the largest stress may occur in the center of the display module DM' and the window module WM', and the display module DM' and the window module WM' may be damaged.

Referring to FIGS. 10B, 19, and 20, because the area of the openings OP and the area of the first and second branches BR1 and BR2 are varied in the support plate PLT according to one or more embodiments of the present disclosure, the rigidity of the support plate PLT may be varied as the distance from the folding axis FX increases. As shown in FIG. 19, the degree of the curvature of the curved surface portion CSP may be reduced. The curvature of the curved surface portion CSP of FIG. 19 may be smaller than the curvature of the curved surface portion CSP' of FIG. 20.

TABLE 1

| | PLT' | PLT |
|---|---|---|
| ellipticity | 1.25 | 1.12 |
| Stress applied to window module WM | 548 MPa | 467 MPa |
| Crease size of window module WM | 120 μm | 102 μm |

Table 1 shows results of a comparison between the ellipticity of the window modules WM and WM' and the stress applied to the window modules WM and WM' when the electronic device ED of FIG. 19 and the electronic device ED' of FIG. 20 are folded. The ellipticity is defined by a ratio of a second diameter Dc to a first diameter Ds. The first diameters Ds and Ds' are defined as a length in the first direction DR1 of a curved surface defined by a portion of the window modules WM and WM', which overlaps with the folding areas FA and FA', when the electronic device ED of FIG. 19 and the electronic device ED' of FIG. 20 are folded. The second diameters Dc and Dc' are defined as a length in the third direction DR3 of the portion of the window modules WM and WM', which overlaps with the folding areas FA and FA', when the electronic device ED of FIG. 19 and the electronic device ED' of FIG. 20 are folded.

The crease size of the window modules WM and WM' is defined as a difference in lengths between a crest and a trough, which are formed in the center of the window module WM due to the repeated folding and non-folding modes.

The window module WM' of FIG. 20 has the ellipticity of about 1.25. In this case, the portion of the window module WM', which overlaps with the folding axis FX, has the stress of about 548 MPa.

The window module WM of FIG. 19 has the ellipticity of about 1.12. However, the ellipticity of the window module WM is not limited thereto or thereby, and may be within a range from about 1 to about 1.2. The portion of the window module WM, which overlaps with the folding axis FX, has the stress of about 467 MPa.

In the support plate PLT according to one or more embodiments of the present disclosure, as the curvature of the curved surface portion CSP decreases, the stress applied to the curved surface portion CSP may decrease. As the stress applied to the curved surface portion CSP decreases, the curvature of the portion of the display module DM and the portion of the window module WM, which overlap with the curved surface portion CSP, may decrease. The radius of the portion of the display module DM and the portion of the window module WM, which overlap with the curved surface portion CSP, may decrease. Accordingly, the stress applied to the portion of the display module DM and the portion of the window module WM, which overlap with the curved surface portion CSP, may decrease. Thus, the display module DM and the window module WM may be prevented or substantially prevented from being damaged.

In addition, as shown in Table 1, the crease size of the portion of the window module WM, which overlaps with the folding axis FX, may decrease. Accordingly, even though the folding and non-folding operations are repeated, the crease size may decrease, and thus, a surface quality of the electronic device ED may be improved.

Referring to FIG. 21, when an electronic device ED" is folded, a first extension portion EX1" and a second extension portion EX2" may not be bent.

The first extension portion EX1" may be flat or substantially flat. The first inverse curvature portion ICV1 (e.g., refer to FIG. 19) may not be defined between the first extension portion EX1" and the first non-folding area NFA1.

The second extension portion EX2" may be flat or substantially flat. The second inverse curvature portion ICV2 (e.g., refer to FIG. 19) may not be defined between the second extension portion EX2" and the second non-folding area NFA2.

Referring to FIGS. 20 and 21, a curvature of the window module WM" overlapping with a curvature portion CSP" of FIG. 21 may be smaller than the curvature of the window module WM' overlapping with the curvature portion CSP' of FIG. 20. A radius of the window module WM" overlapping with the curvature portion CSP" of FIG. 21 may be greater than the radius of the window module WM' overlapping with the curvature portion CSP' of FIG. 20.

Accordingly, stress applied to the window module WM" overlapping with the curvature portion CSP" of FIG. 21 may be smaller than the stress applied to the window module WM' overlapping with the curvature portion CSP' of FIG. 20. Therefore, when the electronic device ED" is folded, the window module WM" of FIG. 21 may be prevented or substantially prevented from being damaged.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims.

What is claimed is:

1. A display device comprising:

a display panel; and a support plate under the display panel, and comprising a first non-folding portion, a folding portion, and a second non-folding portion, which are located along a first direction, wherein the folding portion is provided with a plurality of openings defined therethrough, the folding portion comprises branches between the openings, wherein the folding portion is configured to be folded with respect to a folding axis parallel to a second direction crossing the first direction, wherein a length in the second direction of each of the openings is greater than a length in the first direction of each of the openings, wherein an area ratio of the openings extending longer in the second direction to the branches is greater at a portion of the folding portion adjacent to at least one of the first or second non-folding portions than at a center of the folding portion, wherein an area between the folding axis and one side of the folding portion comprises:

a central part adjacent to the folding axis;

a second part adjacent to the one side of the folding portion; and a first part between the central part and the second part, wherein in each of the central part, the first part, and the second part, the openings have a same size and are located in at least two rows corresponding to the second direction, and wherein the area ratio of the openings is greater in the first part than in the central part, and greater in the second part than in the first part.

2. The display device of claim 1, wherein the branches comprise:

a plurality of first branches between the openings that are adjacent to each other in the first direction; and a plurality of second branches between the openings that are adjacent to each other in a second direction crossing the first direction.

3. The display device of claim 2, wherein the folding portion is configured to be folded with respect to the folding axis overlapping with the center of the folding portion, and wherein the folding axis overlaps with one of the first branches.

4. The display device of claim 2, wherein at least one of a length in the first direction of the first branches, a length in the second direction of the second branches, a length in the first direction of the openings, or a length in the second direction of the openings is varied as a distance from the center of the folding portion increases.

5. The display device of claim 4, wherein, in a plan view, the length in the first direction of the first branches decreases as the distance from the center of the folding portion increases in the first direction.

6. The display device of claim 5, wherein, in a plan view, the length in the first direction of the openings increases as the distance from the center of the folding portion increases in the first direction.

7. The display device of claim 4, wherein, in a plan view, the length in the second direction of the openings increases as the distance from the center of the folding portion in the first direction increases.

8. The display device of claim 7, wherein, in a plan view, the length in the second direction of the second branches located between the openings that are adjacent to each other in the second direction decreases as the distance from the center of the folding portion in the first direction increases.

9. The display device of claim 4, wherein the length in the second direction of the second branches decreases as the distance from the center of the folding portion increases, and the length in the second direction of the openings is uniform.

10. The display device of claim 4, wherein the length in the first direction of the openings increases as the distance from the center of the folding portion increases, and the length in the first direction of the first branches is uniform.

11. The display device of claim 1, wherein the folding portion further comprises:

a center portion overlapping with the center of the folding portion in a plan view; and sub-folding portions at opposite sides of the center portion in the first direction, and symmetrical with each other.

12. The display device of claim 11, wherein the center portion and each of the sub-folding portions comprise:

a plurality of first branches between the openings that are adjacent to each other in the first direction; and a plurality of second branches between the openings that are adjacent to each other in a second direction crossing the first direction.

13. The display device of claim 12, wherein, in a plan view, an area between the openings defined through the center portion is different from an area between the openings defined through the sub-folding portions.

14. The display device of claim 13, wherein the first branches of the center portion have the same length as each other, wherein the first branches of the sub-folding portions have the same length as each other, and wherein a length in the first direction of the first branches of the sub-folding portions is smaller than a length in the first direction of the first branches of the center portion.

15. The display device of claim 13, wherein the openings defined through the center portion have the same length as each other in the second direction, wherein the openings defined through the sub-folding portions have the same length as each other in the second direction, and wherein the length in the second direction of the openings defined through the center portion is smaller than the length in the second direction of the openings defined through the sub-folding portions.

16. The display device of claim 15, wherein the second branches of the center portion have the same length as each other in the second direction, wherein the second branches of the sub-folding portions have the same length as each other in the second direction, and wherein the length in the second direction of the second branches of the center portion is greater than the length in the second direction of the second branches of the sub-folding portions.

17. The display device of claim 13, wherein the openings defined through the center portion have the same length as each other in the first direction, wherein the openings defined through the sub-folding portions have the same length as each other in the first direction, and wherein the length in the first direction of the openings defined through the center portion is smaller than the length in the first direction of the openings defined through the sub-folding portions.

18. The display device of claim 1, wherein, when the display panel is folded, a portion of the display panel that overlaps with the folding portion is bent to have a first diameter in a direction parallel to the first direction, and a second diameter in a third direction perpendicular to a plane defined by the first direction and a second direction crossing the first direction, and wherein a ratio of the first diameter to the second diameter is within a range from 1 to 1.2.

19. An electronic device comprising a display device for providing an image, the display device comprising:

a display panel; and a support plate under the display panel, and comprising a first non-folding portion, a folding portion, and a second non-folding portion, which are located along a first direction so that the folding portion is between the first and second non-folding portions, wherein the folding portion comprises:

a plurality of first branches located between openings that are adjacent to each other in the first direction from among openings defined through the folding portion; and a plurality of second branches located between openings adjacent to each other in a second direction crossing the first direction from among the openings defined through the folding portion, wherein the folding portion is configured to be folded with respect to a folding axis parallel to the second direction, wherein a length in the second direction of each of the openings is greater than a length in the first direction of each of the openings, wherein, in a plan view, an area ratio of the openings extending longer in the second direction to the first and second branches increases starting from a center of the folding portion to the first and second non-folding portions, wherein an area between the folding axis and one side of the folding portion comprises:

a central part adjacent to the folding axis;

a second part adjacent to the one side of the folding portion; and a first part between the central part and the second part, wherein in each of the central part, the first part, and the second part, the openings have a same size and are located in at least two rows corresponding to the second direction, and wherein the area ratio of the openings is greater in the first part than in the central part, and greater in the second part than in the first part.

20. The electronic device of claim 19, wherein the folding axis overlaps with one of the first branches in a plan view, and wherein at least one of a length in the first direction of the first branches, a length in the second direction of the second branches, a length in the first direction of the openings, or a length in the second direction of the openings is varied as a distance from the center of the folding portion increases.

* * * * *